(12) United States Patent
Pfirsch

(10) Patent No.: US 11,289,595 B2
(45) Date of Patent: Mar. 29, 2022

(54) POWER SEMICONDUCTOR DEVICE AND METHOD

(71) Applicant: Infineon Technologies Austria AG, Villach (AT)

(72) Inventor: Frank Dieter Pfirsch, Munich (DE)

(73) Assignee: INFINEON TECHNOLOGIES AUSTRIA AG, Villach (AT)

(*) Notice: Subject to any disclaimer, the term of this patent is extended or adjusted under 35 U.S.C. 154(b) by 56 days.

(21) Appl. No.: 16/924,466

(22) Filed: Jul. 9, 2020

(65) Prior Publication Data
US 2021/0020777 A1    Jan. 21, 2021

(30) Foreign Application Priority Data

Jul. 18, 2019   (DE) .......................... 102019119522.5

(51) Int. Cl.
| | |
|---|---|
| H01L 21/22 | (2006.01) |
| H01L 21/26 | (2006.01) |
| H01L 29/06 | (2006.01) |
| H01L 29/78 | (2006.01) |
| H01L 29/10 | (2006.01) |
| H01L 21/266 | (2006.01) |

(52) U.S. Cl.
CPC ........ *H01L 29/7811* (2013.01); *H01L 21/266* (2013.01); *H01L 29/0615* (2013.01); *H01L 29/1095* (2013.01)

(58) Field of Classification Search
CPC ..... H01L 21/22; H01L 21/2253; H01L 21/26; H01L 21/266; H01L 21/2652; H01L 29/06; H01L 29/0615; H01L 29/0688; H01L 29/78; H01L 29/7811; H01L 29/1095

USPC .......................................................... 257/329
See application file for complete search history.

(56) References Cited

U.S. PATENT DOCUMENTS

2007/0272977 A1* 11/2007 Saito .................. H01L 29/0634
257/329
2011/0233714 A1    9/2011 Lu

FOREIGN PATENT DOCUMENTS

| DE | 102009044670 A1 | 6/2010 |
|---|---|---|
| DE | 102017127848 A1 | 5/2019 |

\* cited by examiner

*Primary Examiner* — Fazli Erdem
(74) *Attorney, Agent, or Firm* — Murphy, Bilak & Homiller, PLLC

(57) ABSTRACT

A power semiconductor device includes: a semiconductor body having a front side surface and a drift region having first conductivity type dopants; and an edge termination region that includes a part of the drift region and a first semiconductor region extending along the front side surface. The first semiconductor region includes dopants of both conductivity types and forms a continuous pn-junction with the drift region. An integrated vertical dopant concentration of the second conductivity type dopants is higher than an integrated vertical dopant concentration of the first conductivity type dopants within the first semiconductor region. A first dose profile representing a vertically integrated net dopant concentration of the both conductivity type dopants in the first doped semiconductor region has a smaller degree of waviness along a horizontal direction than a second dose profile representing a vertically integrated dopant concentration of the second conductivity type dopants in the same semiconductor region.

21 Claims, 23 Drawing Sheets

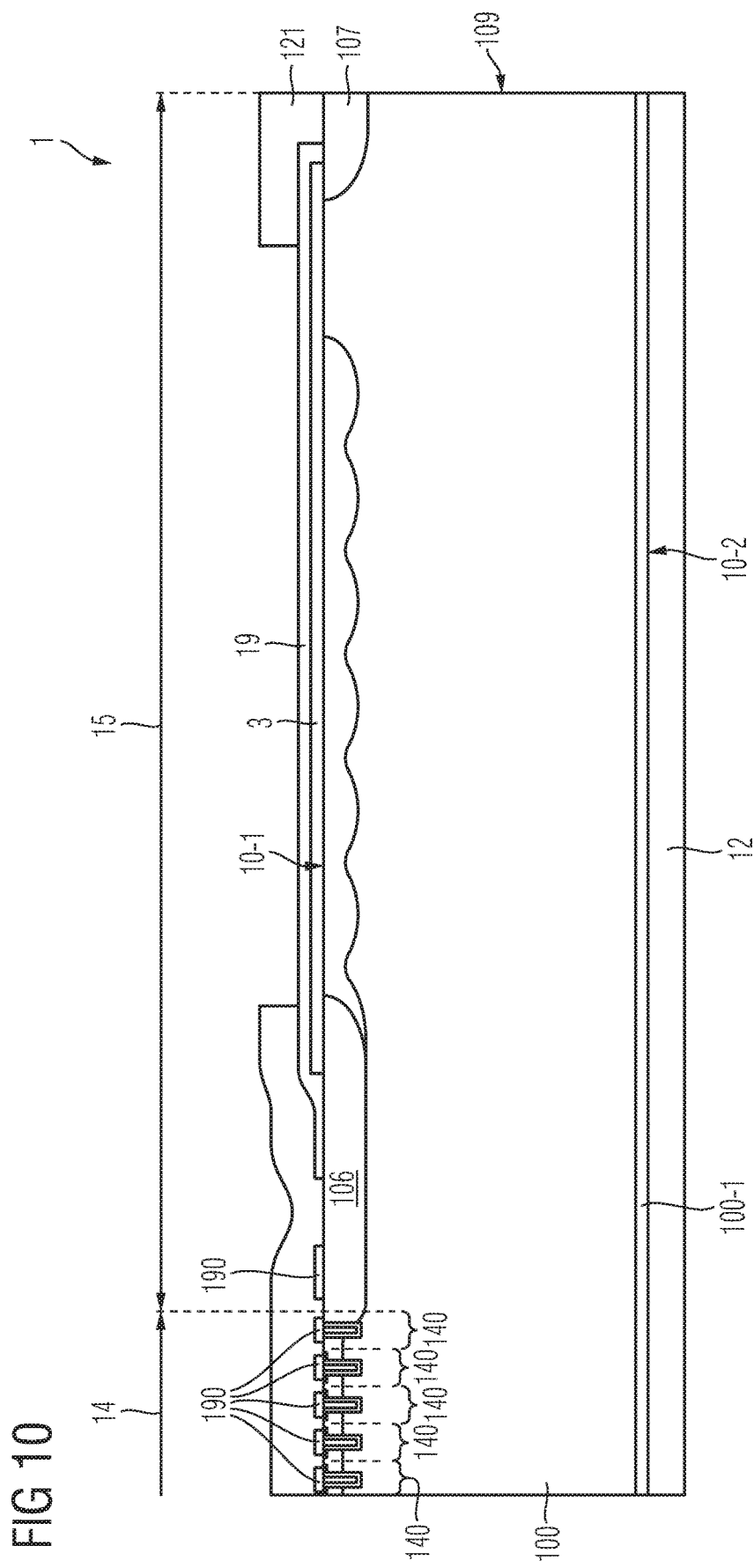

Fig. 12D
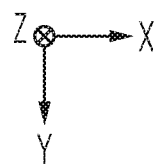
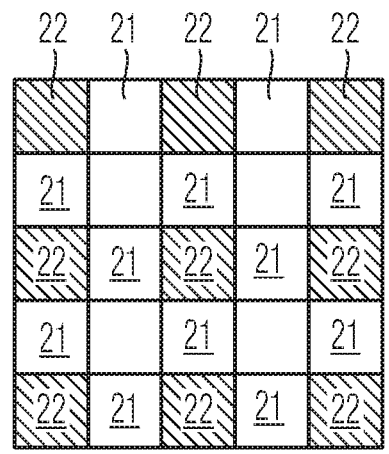
Fig. 12E
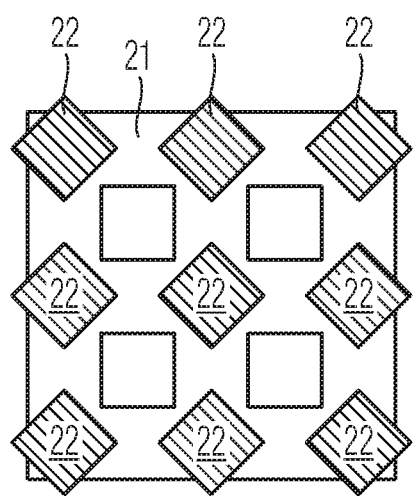

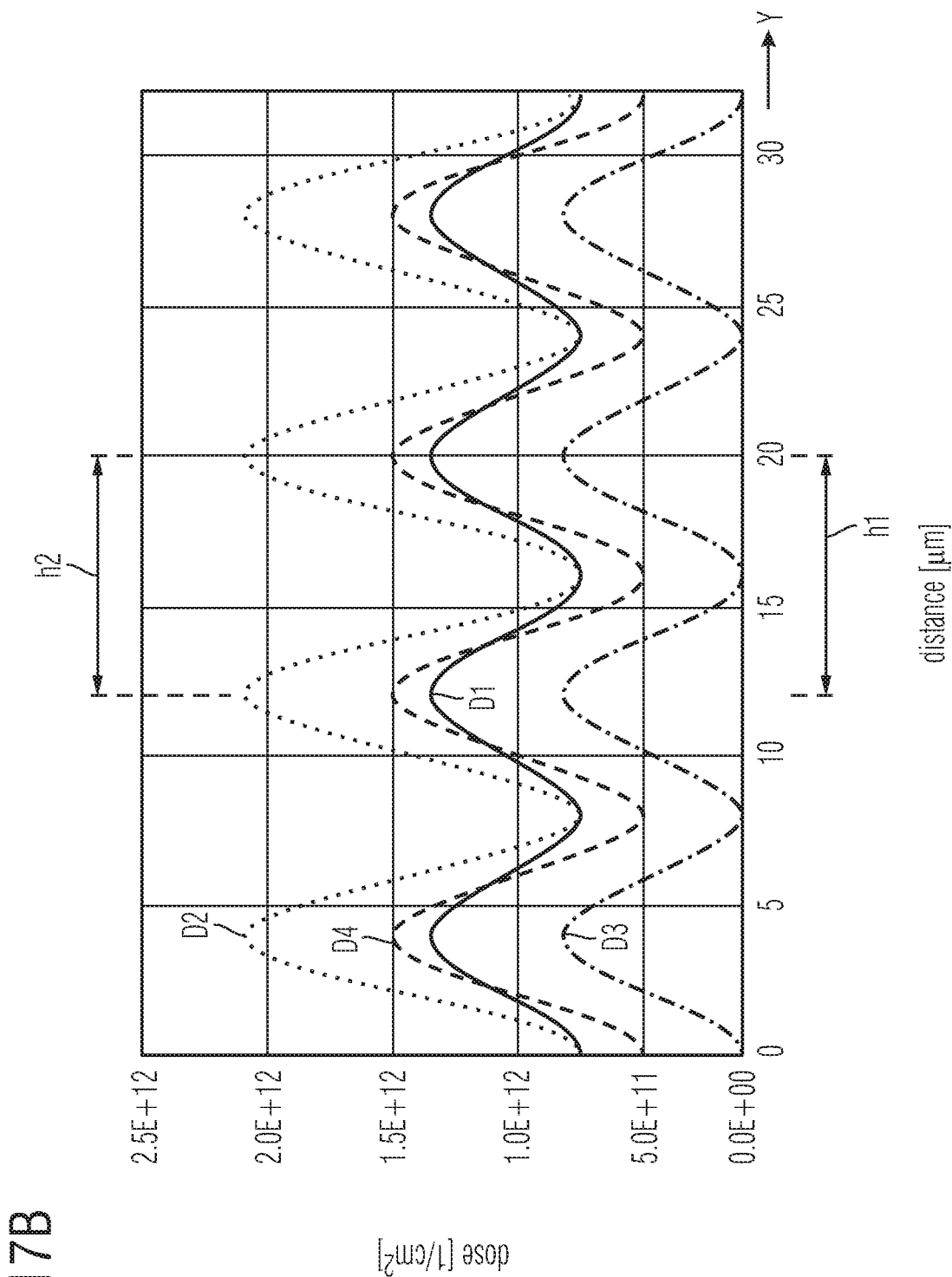

POWER SEMICONDUCTOR DEVICE AND METHOD

TECHNICAL FIELD

This specification refers to embodiments of a power semiconductor device and to embodiments of a method of producing a power semiconductor device. In particular, this specification refers to aspects of a power semiconductor device comprising a doped semiconductor region inside an edge termination region.

BACKGROUND

Many functions of modern devices in automotive, consumer and industrial applications, such as converting electrical energy and driving an electric motor or an electric machine, rely on power semiconductor devices. For example, Insulated Gate Bipolar Transistors (IGBTs), Metal Oxide Semiconductor Field Effect Transistors (MOSFETs) and diodes, to name a few, have been used for various applications including, but not limited to switches in power supplies and power converters.

A power semiconductor device usually comprises a semiconductor body configured to conduct a load current along a load current path between two load terminals of the device.

Further, for conducting the load current, the power semiconductor device may comprise one or more power cells which may be arranged in a so-called active area (or active region) of the power semiconductor device. For example, in case of a controllable power semiconductor device, e.g., a transistor, the load current path may be controlled by means of an insulated electrode, commonly also referred to as gate electrode. For example, upon receiving a corresponding control signal from, e.g., a driver unit, the control electrode may set the power semiconductor device in one of a conducting state and a blocking state. In some cases, the gate electrode may be included within a trench of the power semiconductor switch, wherein the trench may exhibit, e.g., a stripe configuration or a needle configuration.

The power semiconductor device may be laterally confined by an edge, such as a lateral chip edge. Between the edge and the active area that comprises the one or more power cells, there may be arranged an edge termination region, which may comprise an edge termination structure. Such an edge termination structure may serve for the purpose of influencing the course of an electric field within the semiconductor body, e. g., so as to ensure a reliable blocking capability of the power semiconductor device. The edge termination structure may comprise one or more components arranged within the semiconductor body as well as one or more components arranged above a surface of the semiconductor body.

Some common edge termination structures, such as variation-of-lateral-doping (VLD) edge termination structures, comprise one or more doped semiconductor regions of a defined shape. It is generally desirable to create such doped semiconductor regions at relatively low costs, e. g., in a way that allows for a relatively fine definition of their shape, but does not require dedicated lithography techniques with a very fine resolution.

SUMMARY

Aspects described herein relate to a specific design of a doped semiconductor region inside an edge termination region of a power semiconductor device, wherein a part of a first implanted dopant dose of one conductivity type (e. g., p-type) is compensated by a second implanted dopant dose of the complementary conductivity type (e. g., n-type). For example, the second implanted dopants may be diffused to a smaller lateral extension than the first implanted dopants. As a result, a waviness of a vertically integrated net dopant concentration of the doped semiconductor region may be reduced.

According to an embodiment, a power semiconductor device comprises: a semiconductor body having a front side surface and including a drift region having dopants of a first conductivity type; and an edge termination region, the edge termination region being included in the semiconductor body and comprising: a part of the drift region; a first semiconductor region extending along the front side surface, the first semiconductor region comprising dopants of the first conductivity type and dopants of a second conductivity type complementary to the first conductivity type, wherein an integrated vertical dopant concentration of the dopants of the second conductivity type is higher than an integrated vertical dopant concentration of dopants of the first conductivity type within the first semiconductor region. The first semiconductor region forms a continuous pn-junction with the drift region. A first dose profile representing a vertically integrated net dopant concentration of the dopants of the first and second conductivity types in the first doped semiconductor region exhibits a smaller degree of waviness along a horizontal direction than a second dose profile representing a vertically integrated dopant concentration of the dopants of the second conductivity type in the first doped semiconductor region.

According to another embodiment, a method of producing a power semiconductor device is presented. The method comprises: providing a semiconductor body having a front side surface and including a drift region having dopants of a first conductivity type; and forming inside the semiconductor body an edge termination region. Forming the edge termination region comprises forming a first doped semiconductor region extending along the front side surface and forming a continuous pn-junction with the drift region, wherein the forming of the first doped semiconductor region comprises the following steps: implanting dopants of a second conductivity type through the front side surface by means of a first masked implantation, wherein a first mask is used for the first masked implantation, the first mask defining first open areas and first masked areas; and implanting dopants of a first conductivity type through the front side surface by means of a second masked implantation wherein a second mask is used for the second masked implantation, the second mask defining second open areas and second masked areas. The first mask and the second mask are arranged on the semiconductor body in such a way that open areas of the second mask overlaying the first doped semiconductor region during the second implantation step horizontally overlap with open areas of the first mask overlaying the first doped semiconductor region during the first masked implantation. Further, the first mask and the second mask are arranged on the semiconductor body in such a way that closed areas of the second mask overlaying the first doped semiconductor region during the second implantation step horizontally overlap with closed areas of the first mask overlaying the first doped semiconductor region during the first masked implantation.

According to a further embodiment, a method of producing a power semiconductor device comprises: providing a semiconductor body having a front side surface, and including a drift region having dopants of a first conductivity type;

and forming inside the semiconductor body an edge termination region, wherein forming the edge termination region comprises: forming a first doped semiconductor region extending along the front side surface and forming a continuous pn-junction with the drift region; and forming a further doped semiconductor region in the semiconductor body. The forming of the first doped semiconductor region and the further doped semiconductor region comprises the following steps: forming a structured screening layer on the front side, the structured screening layer covering the first doped semiconductor region to be formed, wherein the structured screening layer is not present on the further doped semiconductor region to be formed; implanting by means of a first mask, in a first implantation step, dopants through the structured screening layer and into the semiconductor body with a first implantation energy; implanting by means of the first mask, in a further implantation step, dopants into the structured screening layer and into the semiconductor body with a second implantation energy that is lower than the first implantation energy; wherein the first mask is open above the further doped semiconductor region to be formed, and wherein the first mask defines first open areas and first masked areas, wherein in a cross-section along a horizontal direction, an area ratio of the open areas to the masked areas above the first semiconductor region decreases in a direction pointing from an active region of the power semiconductor device to a lateral edge of the semiconductor body.

Those skilled in the art will recognize additional features and advantages upon reading the following detailed description, and upon viewing the accompanying drawings.

BRIEF DESCRIPTION OF THE DRAWINGS

The parts in the figures are not necessarily to scale. Instead, emphasis is placed upon illustrating principles of the invention. Moreover, in the figures, like reference numerals designate corresponding parts. In the drawings:

FIG. 10 schematically and exemplarily illustrates a section of a vertical cross-section of a power semiconductor device in accordance with one or more embodiments;

FIGS. 12A-E each schematically and exemplarily illustrate a section of two different implantation mask used in a method in accordance with one or more embodiments;

FIGS. 17A-C each schematically and exemplarily illustrate lateral profiles of doping doses (after diffusion) in accordance with one or more embodiments.

DETAILED DESCRIPTION

Figure 1A:
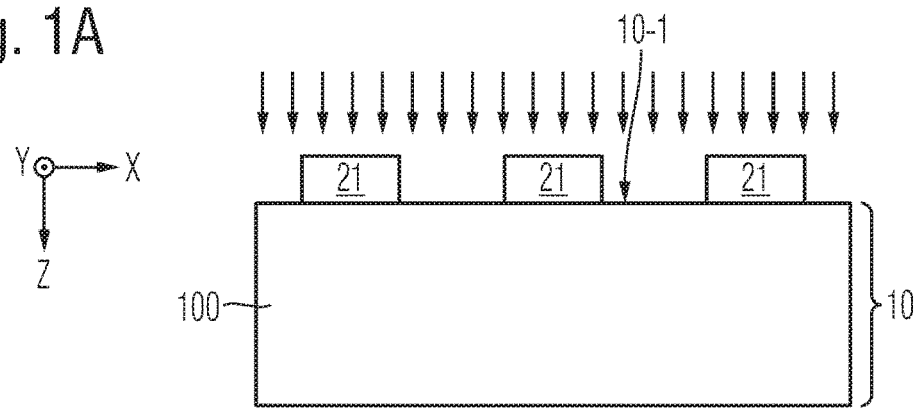
FIGS. 1A-G each schematically and exemplarily illustrate process steps of a method of producing a power semiconductor device in accordance with one or more embodiments.
Figure 1B:
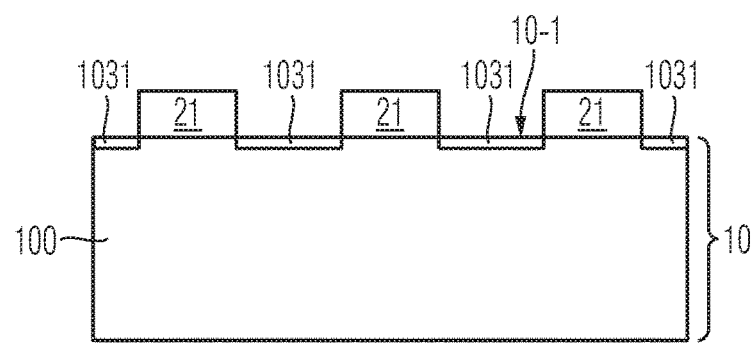
Figure 1C:
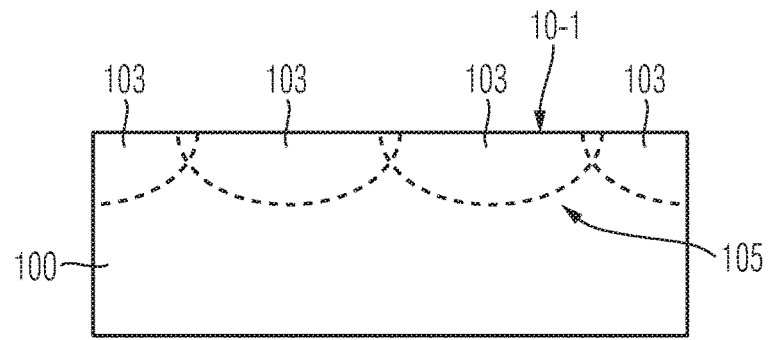

In the following detailed description, reference is made to the accompanying drawings which form a part hereof and in which are shown by way of illustration specific embodiments in which the invention may be practiced.

In this regard, directional terminology, such as "top", "bottom", "below", "front", "behind", "back", "leading", "trailing", "above" etc., may be used with reference to the orientation of the figures being described. Because parts of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appended claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a horizontal surface of a semiconductor substrate or of a semiconductor structure. This can be for instance the surface of a semiconductor wafer or a die or a chip. For example, both the first lateral (or horizontal) direction X and the second lateral (or horizontal) direction Y mentioned below and/or shown in the Figures can be horizontal directions, wherein the first lateral direction X and the second lateral direction Y may be perpendicular to each other.

The term "vertical" as used in this specification intends to describe an orientation which is substantially arranged perpendicular to the horizontal surface, i.e., parallel to the normal direction of the surface of the semiconductor wafer/chip/die. For example, the vertical direction Z mentioned below and/or shown in the Figures may be a direction that is perpendicular to both the first lateral direction X and the second lateral direction Y.

In this specification, n-doped is generally referred to as "first conductivity type" while p-doped is referred to as "second conductivity type". Alternatively, opposite doping relations can be employed so that the first conductivity type can be p-doped and the second conductivity type can be n-doped.

In the context of the present specification, the terms "in ohmic contact", "in electric contact", "in ohmic connection", and "electrically connected" intend to describe that there is a low ohmic electric connection or low ohmic current path between two regions, sections, zones, portions or parts of a semiconductor device or between different terminals of one or more devices or between a terminal or a metallization or an electrode and a portion or part of a semiconductor device. Further, in the context of the present specification, the term "in contact" intends to describe that there is a direct physical connection between two elements of the respective semiconductor device; e.g., a transition between two elements being in contact with each other may not include a further intermediate element or the like.

In addition, in the context of the present specification, the term "electric insulation" is used, if not stated otherwise, in the context of its general valid understanding and thus intends to describe that two or more components are positioned separately from each other and that there is no ohmic connection connecting those components. However, components being electrically insulated from each other may nevertheless be coupled to each other, for example mechanically coupled and/or capacitively coupled and/or inductively coupled. To give an example, two electrodes of a capacitor may be electrically insulated from each other and, at the same time, mechanically and capacitively coupled to each other, e.g., by means of an insulation, e.g., a dielectric.

Specific embodiments described in this specification pertain to, without being limited thereto, a power semiconductor device exhibiting a single cell, a stripe cell or cellular (also referred to as "needle" or "columnar") cell configuration, e.g., a power semiconductor device that may be used within a power converter or a power supply. Thus, in an embodiment, such device can be configured to carry a load current that is to be fed to a load and/or, respectively, that is provided by a power source. For example, the power semiconductor device may comprise one or more active power semiconductor cells, such as a monolithically integrated diode cell, a derivative of a monolithically integrated diode cell (e.g., a monolithically integrated cell of two anti-serially connected diodes), a monolithically integrated transistor cell, e.g., a monolithically integrated IGBT or MOSFET cell and/or derivatives thereof. Such diode/transistor cells may be integrated in a power semiconductor module. A plurality of such power cells may constitute a cell field that is arranged with an active area of the power semiconductor device.

The term "power semiconductor device" as used in this specification intends to describe a semiconductor device on a single chip with high voltage blocking and/or high current-carrying capabilities. In other words, such power semiconductor device is intended for high current, typically in the Ampere range, e.g., up to several ten or hundred Ampere, and/or high voltages, typically above 15 V, more typically 100 V and above, e.g., up to at least 400 V or even more, e.g., up to at least 3 kV, or even up to 6 kV or more.

For example, the power semiconductor device described below may be a single semiconductor chip exhibiting a single cell configuration, a stripe cell configuration or a cellular cell configuration and can be configured to be employed as a power component in a low-, medium- and/or high voltage application.

For example, the term "power semiconductor device" as used in this specification is not directed to logic semiconductor devices that are used for, e.g., storing data, computing data and/or other types of semiconductor based data processing.

FIGS. 1A-G each schematically and exemplarily illustrate process steps of a method of producing a power semiconductor device 1 in accordance with one or more embodiments.

At the start, a semiconductor body 10 having a front side surface 10-1 is provided (see FIG. 1A). For example, the semiconductor body 10 may be provided in the form of a wafer having a wafer surface 10-1 that extends in each of a first horizontal direction X and a second horizontal direction Y (i.e., in a horizontal plane XY).

The semiconductor body 10 includes a drift region 100 of a first conductivity type (e.g. n-type). For example, the drift region may be an intrinsically doped region of the semiconductor body 10. Alternatively, the drift region may have come into being by means of an implantation of dopants of the first conductivity type. The drift region may be, for example, an $n^-$-doped region that may be configured for conducting a load current through the (processed) power semiconductor device 1.

As a further step, the method may include forming inside the semiconductor body 10 an edge termination region 105. For example, in an embodiment in accordance with FIGS. 1A-G, the edge termination region 105 may form at least a part of a Variation-of-Lateral-Doping (VLD) edge termination region. This is to say that the edge termination region 105 to be formed may exhibit a lateral variation of a mean net dopant concentration in a direction pointing from an active region to the lateral edge of the semiconductor body 10, such that there is a higher mean dose close to the active region than at a position close to the lateral edge. Thus, in an embodiment, the method may comprise producing such a VLD region or at least a part thereof.

Forming the edge termination region 105 may comprise forming a first doped semiconductor region 103 in the semiconductor body 10 by means of a first masked implantation of dopants of the second conductivity type (e.g., p-type) through the front side surface 10-1. For example, as a result of the first masked implantation, first implanted surface regions 1031 may be formed below first open areas (see FIG. 1B). For example, a first mask 21 (such as a resist mask or a hard mask) may be used for the first masked implantation, the first mask defining first open areas and first masked areas (see FIG. 1A).

Regarding the layout of the first mask 21, for example, in a cross-section along a horizontal direction X, Y (e.g. in a cross-section along each of the first and second horizontal directions X, Y), an area ratio of the first open areas to the first masked areas above the first semiconductor region 103 may decrease (e.g., on average, i.e., not necessarily monotonously) in a direction pointing from an active region of the power semiconductor device 1 to a lateral edge of the semiconductor body 10 (not illustrated in FIGS. 1A-G). Thus a lateral variation of the dopant concentration may be achieved, as intended for a VLD edge termination region 105. This may be more readily understood when considering FIGS. 18A-C, which will be explained further below.

Forming the first doped semiconductor region 103 may further comprise at least one diffusion step to diffuse the dopants of the second conductivity type. In the diffusion step, the first implanted surface regions 1031 may be broadened and deepened so as to form the first doped semiconductor region 103 as schematically and exemplarily illustrated FIGS. 1C-D. For example, as a result of the at least one diffusion step, the first doped semiconductor region 103 may seamlessly extend inside the semiconductor body 10 along the front side surface 10-1 and form a continuous pn-junction J with the drift region 100.

Figure 1D:
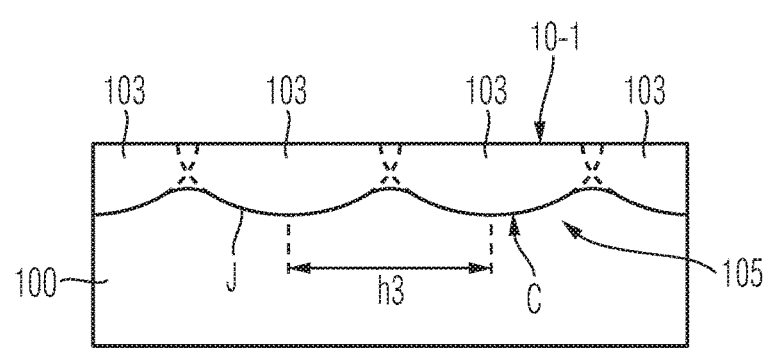

The pn-junction J may define a rippled or wavy course, as schematically and exemplarily illustrated in FIG. 1D. For example, in an embodiment, a rippled contour C describing the vertical extension of the dopants of the second conductivity type from the front side 10-1 into the semiconductor body 10, may exhibit a plurality of local maxima, wherein neighboring local maxima of the rippled contour C may be spaced apart from one another at least by a third horizontal h3 distance amounting to at least 2 μm (see FIG. 1D).

Figure 1E:
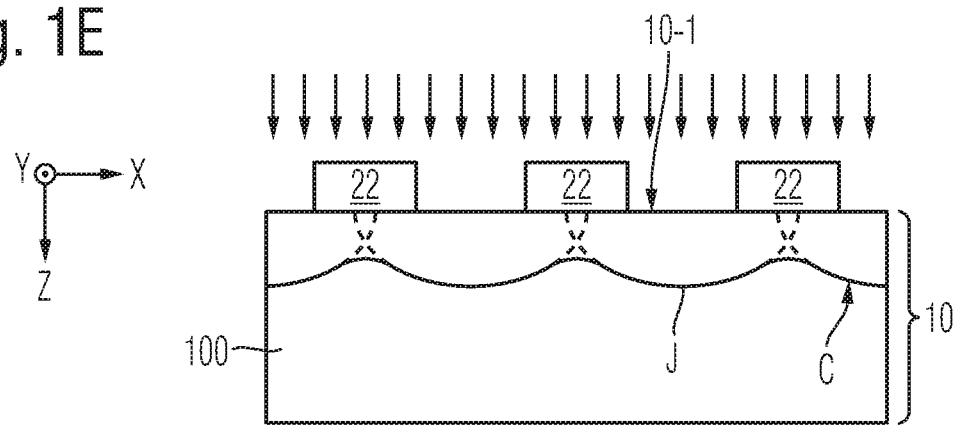
Figure 1F:
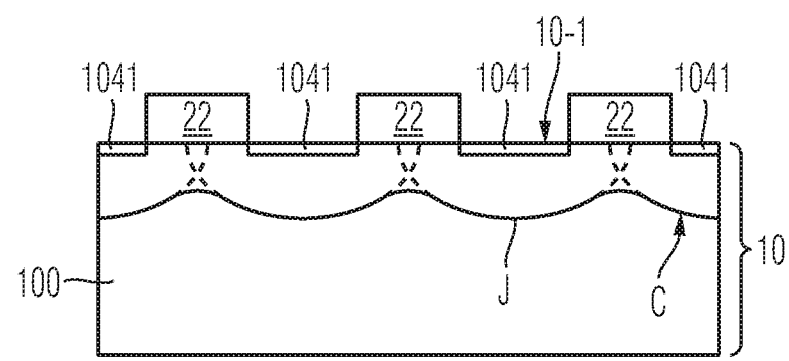

Forming the first doped semiconductor region 103 may further comprise implanting dopants of the first conductivity type (e.g., n-type) through the front side surface 10-1 by means of a second masked implantation step (see FIG. 1E). As a result of the second masked implantation, second implanted surface regions 1041 may be formed below the second open areas (see FIG. 1F).

For example, a second mask 22 is used for the second masked implantation, the second mask defining second open areas and second masked areas. It should be noted that the second mask 22 may be identical with the first mask 21. In other words, a same mask 21, 22 may be used for the first masked implantation and the second masked implantation.

More generally, the second implantation may be carried out with a structuring that is related to the one of the first implantation. In an embodiment, the first mask 21 and the second mask 22 may be arranged on the semiconductor body 10 in such a way that open areas of the second mask 22 overlaying the first doped semiconductor region 103 during the second implantation step horizontally overlap with open areas of the first mask 21 overlaying the first doped semiconductor region 103 during the first masked implantation. Further, the first mask 21 and the second mask 22 may be arranged on the semiconductor body 10 in such a way that closed areas of the second mask 22 overlaying the first doped semiconductor region 103 during the second implantation step horizontally overlap with closed areas of the first mask 21 overlaying the first doped semiconductor region 103 during the first masked implantation.

For example, open areas of the second mask 22 may lie completely within said areas in which the open areas of the first mask 21 have previously been present. Accordingly, open areas of the second mask 22 may be smaller than open areas of the first mask 21.

In an embodiment in accordance with FIGS. 1B-F, the at least one diffusion step mentioned above may be carried out before the implantation of dopants of the first conductivity type.

Figure 1G:
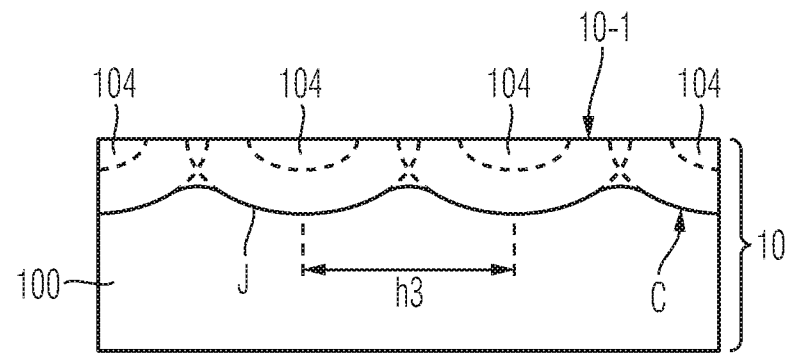
Figure 2A:
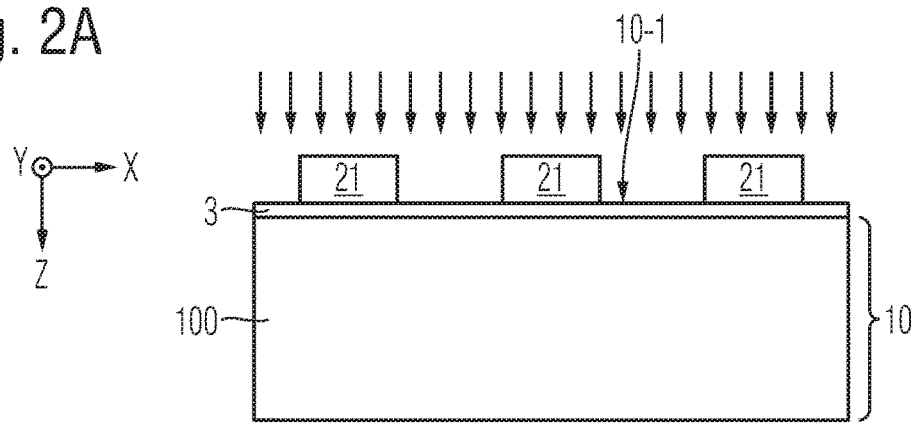
FIGS. 2A-G each schematically and exemplarily illustrate process steps of a method of producing a power semiconductor device in accordance with one or more embodiments.
Figure 2B:
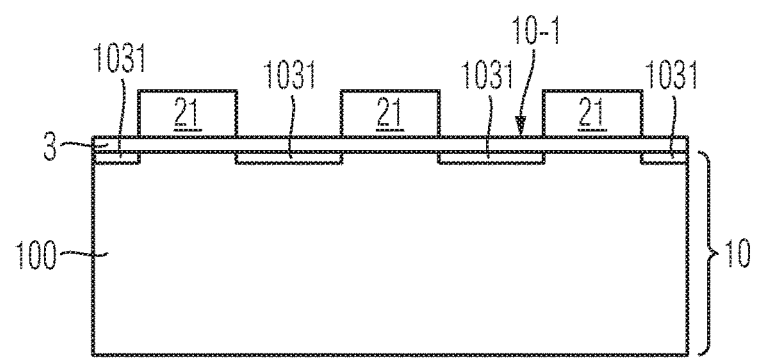
Figure 2C:
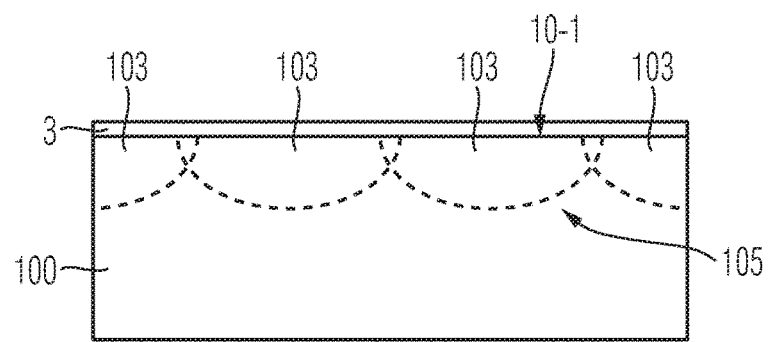
Figure 2D:
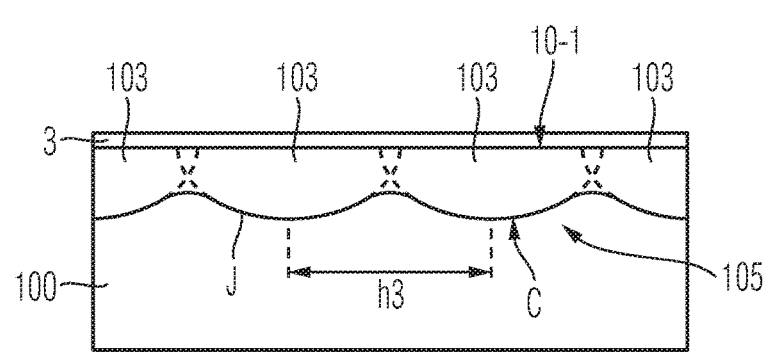
Figure 2E:
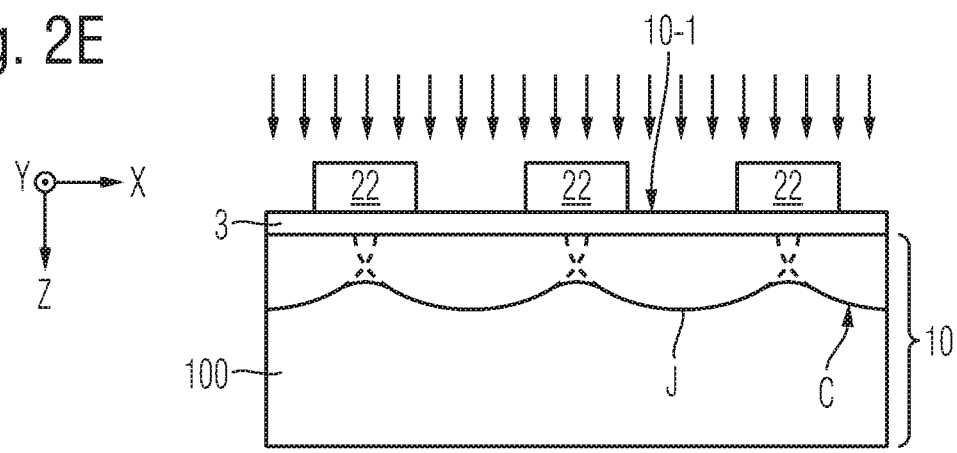
Figure 2F:
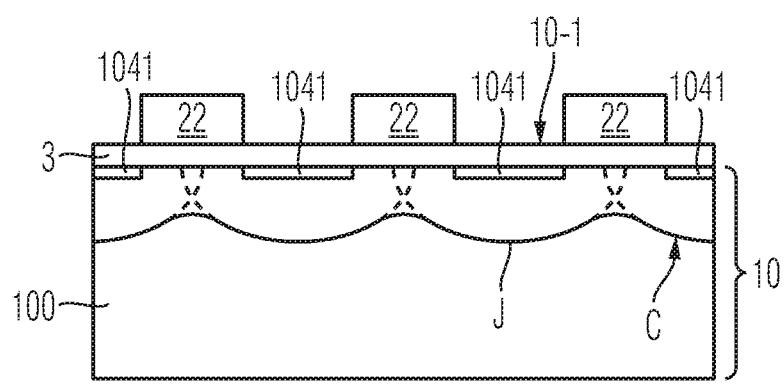
Figure 2G:
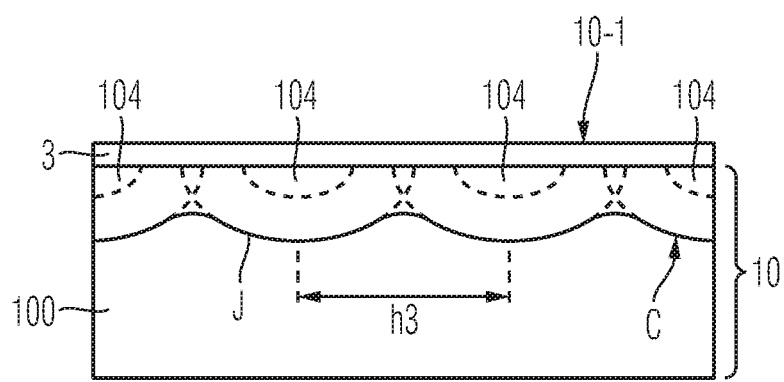

The dopants of the first conductivity type, which have been implanted in the second implantation step, may also be diffused so as to broaden and deepen the second implanted surface regions 1041 into second doped semiconductor regions 104 (see FIG. 1G). For example, the dopants of the first conductivity may be diffused to a smaller lateral extension than the dopants of the second conductivity type, such that the second doped semiconductor regions 104 remain arranged (e.g., separately from one another) inside the first implanted region 103, as illustrated in FIG. 1G.

The result may be a first doped semiconductor region 103 (comprising the second doped semiconductor regions 104) having a net dose that exhibits a more homogeneous distribution than a VLD structure created with a conventional method using the same structure size (i.e., the same size of the first mask opening). This will be explained in further detail below with reference to FIGS. 13 to 17C, which illustrate exemplary lateral dose profiles of the first doped semiconductor region 103.

For example, in an embodiment, the implanted dopants of the first conductivity type may form regions (inside the second doped semiconductor regions 104) where they have a higher concentration than the dopants of the second conductivity type. This may be referred to as a local overcompensation. Alternatively, the implanted dopants of the first conductivity type may have everywhere a lower concentration than the dopants of the second conductivity type, which may be referred to as a partial compensation.

FIGS. 2A-G schematically and exemplarily illustrate process steps of a variant of the method described above with reference to FIGS. 1A-G. In this variant, the dopants of the first conductivity type and the dopants of the second conductivity type are implanted through a screening layer 3, such as an oxide layer, that is arranged above the front side surface 10-1 (e.g., directly on the front side surface 10-1). Hence, for example, FIGS. 2A-G may show a method of producing a VLD region 103 when a thick oxide 3 is arranged above the edge termination region 105.

For example, in case the first mask 21 and/or second mask 22 are resist masks, a thickness of the resist used for the masks 21, 22 may be at least twice the thickness of the thick oxide 3 below the resist.

Further, as schematically and exemplarily illustrated in FIGS. 3A-F, the proposed method may also be integrated into a more comprehensive process that may require other lithography layers. Especially in the case when a relatively thick oxide 3 (e. g., an oxide that is thicker as compared to a gate oxide and/or other oxides in other parts on the semiconductor body 10) is present above the edge termination region 105 to be formed (cf. FIGS. 2A-G), a mask 21, 22 that is used for forming the edge termination region 105 (e.g. the VLD region 103) may also be used for an additional implantation with lower energy that is masked by the thick oxide 3 but not masked in other parts of the semiconductor body 10 that are covered neither by the thick oxide 3 nor by the masks 21, 22, see FIGS. 3A-F. This may refer to the mask(s) 21, 22 used for the first and/or to the second implantation. It should be noted, however, that, for example, a thin oxide 4 (thinner than the thick oxide 3) may be present in said other parts of the semiconductor body, as illustrated in FIGS. 3A-F. For example, a thickness of such a thin oxide 4 may be smaller than a thickness of the oxide layer 3 at least by a factor of 3. For example, the thickness of the thin oxide 4 may be in the range from 20 nm to 200 nm.

Thus, in an embodiment of the proposed method, the dopants of the first conductivity type and/or the dopants of the second conductivity type are implanted through a screening layer 3, such as an oxide layer, that is arranged above the front side surface 10-1, wherein the method may further comprise forming, by means of a third implantation of dopants of the first or second conductivity type through the front side surface 10-1, a third doped semiconductor region 106 extending along the front side surface 10-1 in an area where the front side surface 10-1 is not covered by an oxide layer (such as the oxide layer 3) or in an area where the front side surface 10-1 is at most covered by a thin oxide 4, as exemplarily shown in FIGS. 3A-F. Thus, in accordance with the embodiment illustrated in FIGS. 3A-F, a further (third) doped semiconductor region 106, e.g. in the form of a deep p-well, may be created alongside with a VLD region 10.

Figure 3A:
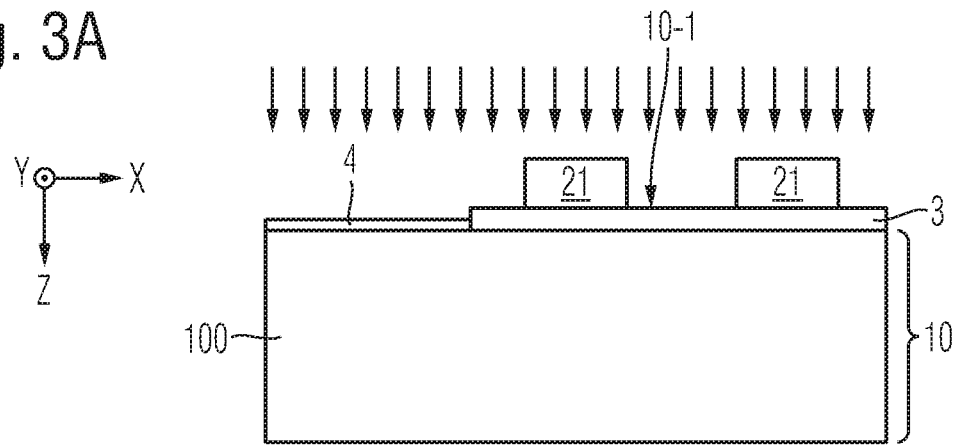
FIGS. 3A-F each schematically and exemplarily illustrate process steps of a method of producing a power semiconductor device in accordance with one or more embodiments.
Figure 3B:
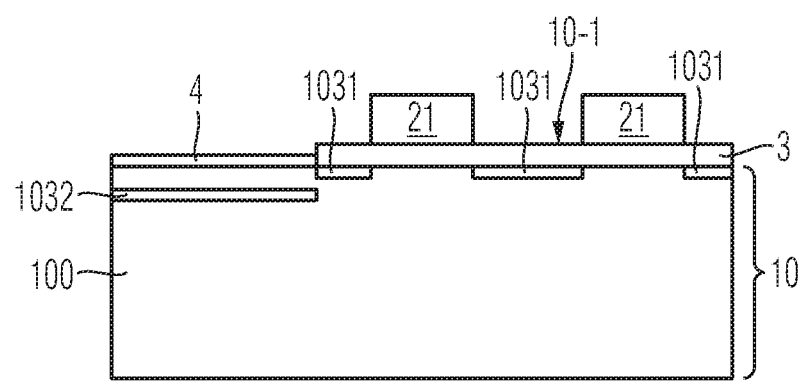
Figure 3C:
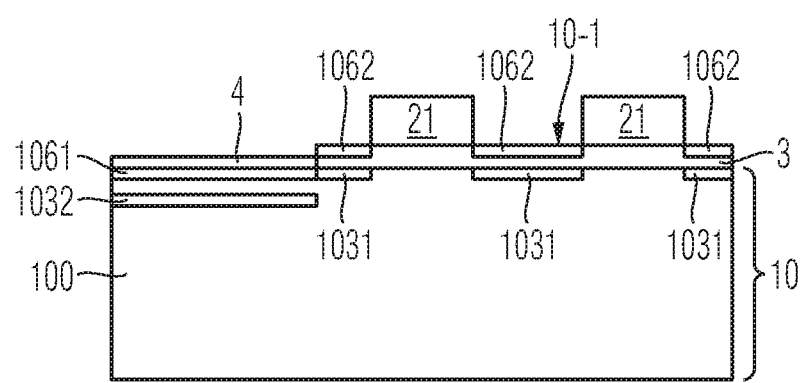
Figure 3D:
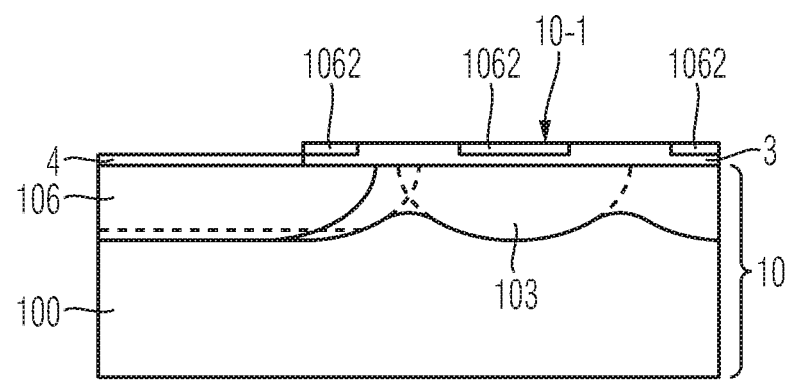
Figure 3E:
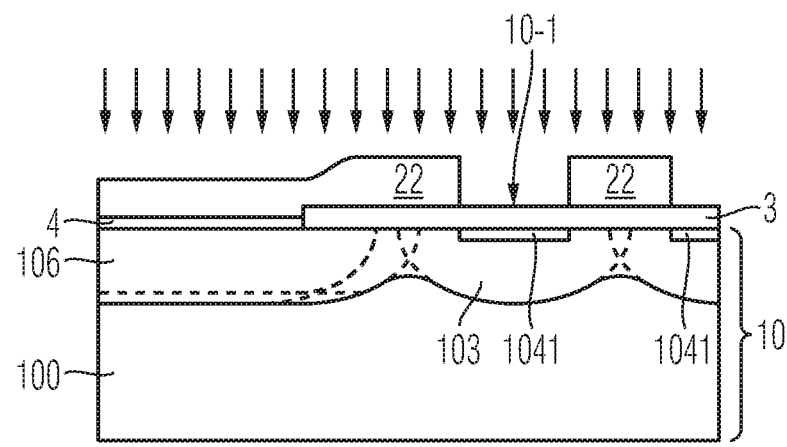
Figure 3F:
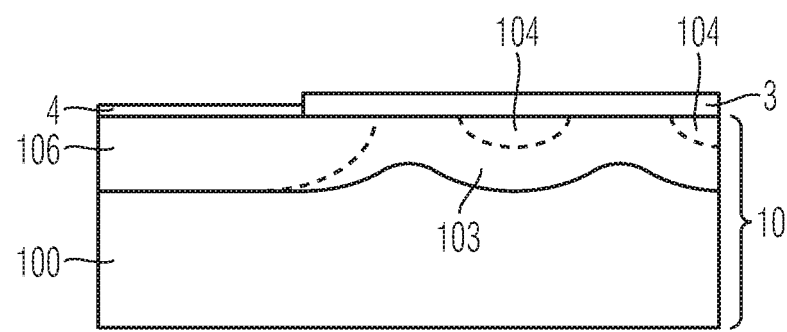
Figure 4A:
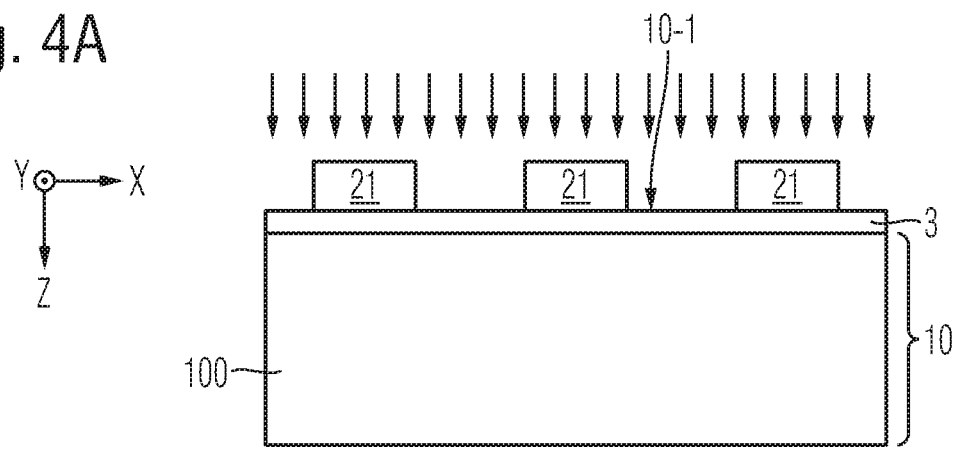
FIGS. 4A-E each schematically and exemplarily illustrate process steps of a method of producing a power semiconductor device in accordance with one or more embodiments.
Figure 4B:
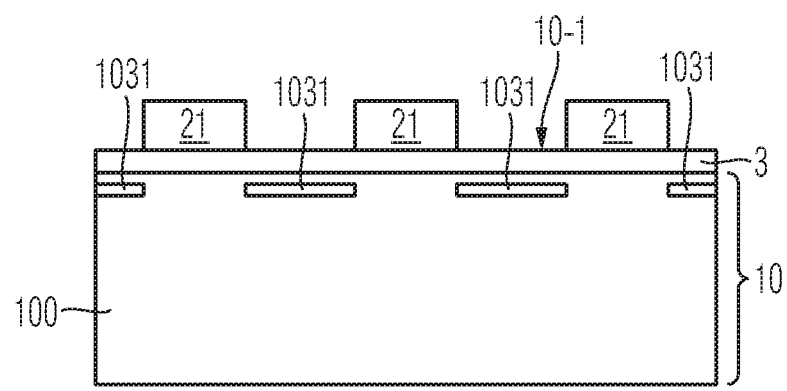
Figure 4C:
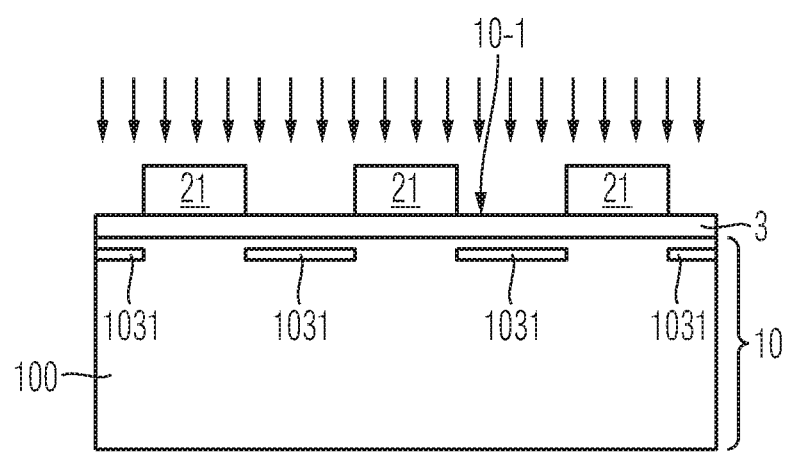
Figure 4D:
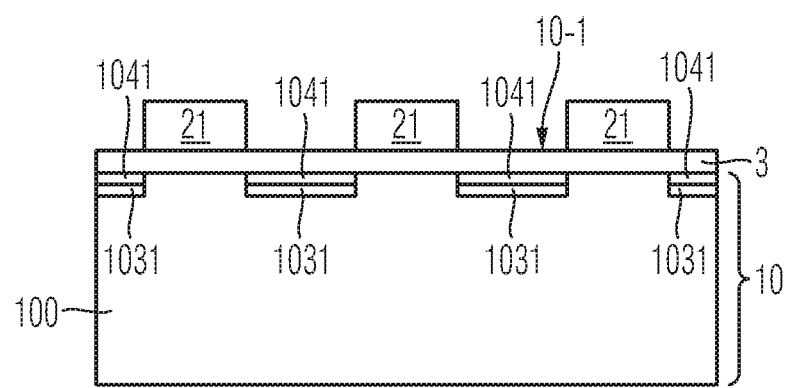
Figure 4E:
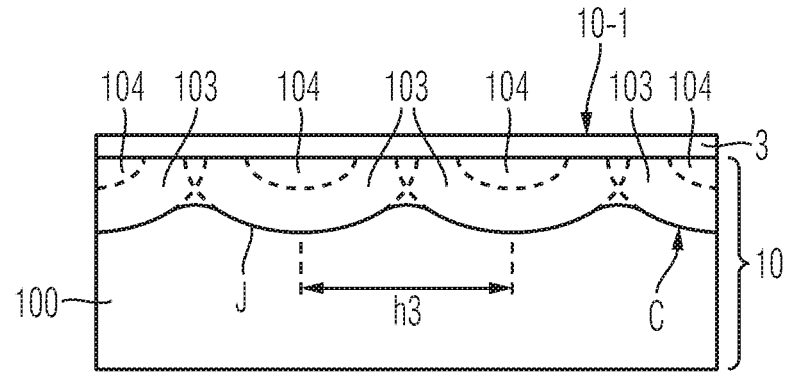
Figure 5A:
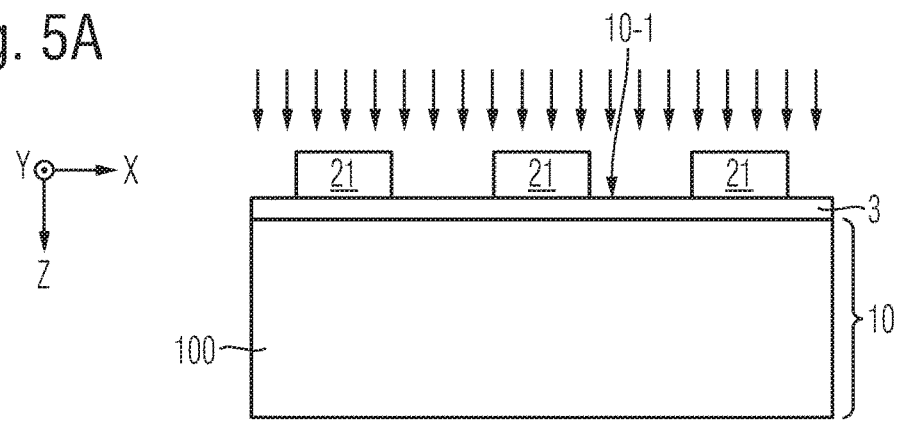
FIGS. 5A-D each schematically and exemplarily illustrate process steps of a method of producing a power semiconductor device in accordance with one or more embodiments.
Figure 5B:
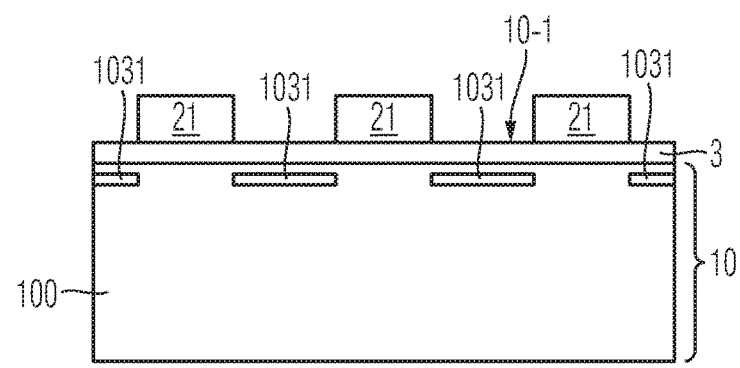
Figure 5C:
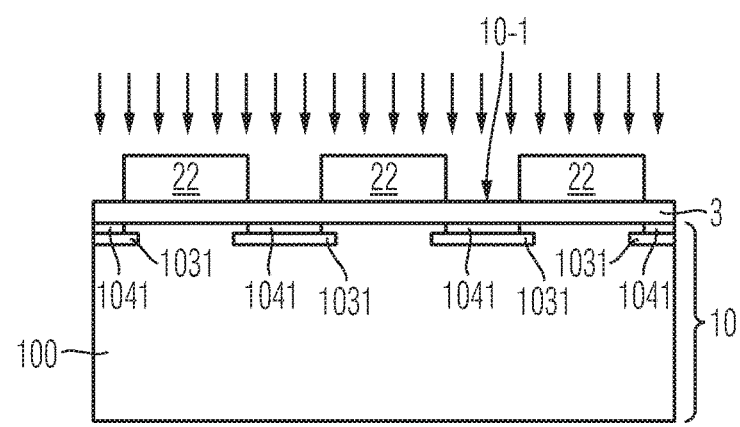
Figure 5D:
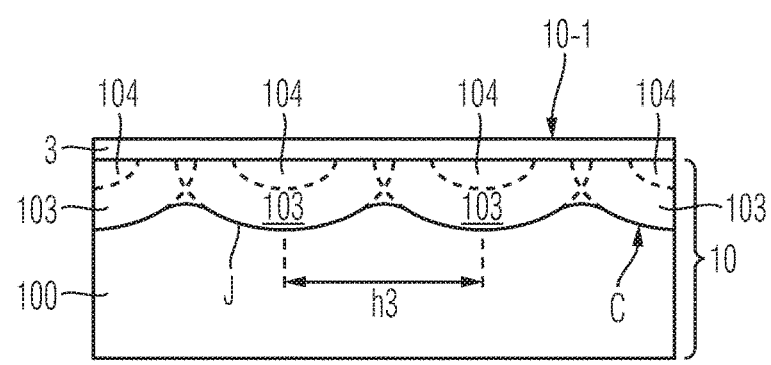

For example, the screening layer 3 may comprise or consist of an oxide layer having a thickness of at least 400 nm. Further, in an embodiment, the third masked implantation may be carried out at a lower energy than the first masked implantation, such that the dopants of the second type do not penetrate the oxide layer 3 during the third masked implantation. This is exemplarily illustrated in FIG. 3C, which shows implanted regions 1062 inside the screening layer 3 in addition to implanted surface regions 1061 inside the semiconductor body 10 where the screening layer 3 is not present. Further, FIGS. 3B-C show first implanted surface regions 1031 as well as (deeper) implanted regions 1032 in the semiconductor body 10, which result from the first masked implantation. After diffusion, the implanted surface regions 1061 and the (deeper) implanted regions 1031 together may form the third doped semiconductor region 106, as illustrated, e. g., in FIG. 3D.

In an embodiment, a same mask 21 may be used for the first masked implantation and the third masked implantation. Alternatively, a same mask 22 may be used for the first masked implantation and the third masked implantation. For example, in that case, a further (fourth) implantation may also be carried out with that same (second) mask 22, wherein the fourth implantation may create, e.g., an n-well functioning as a channel stopper region (not illustrated).

For example, in an embodiment, a method of processing a power semiconductor device in accordance with one or more embodiments may comprise:

providing a semiconductor body 10 having a front side surface 10-1, and including a drift region 100 having dopants of a first conductivity type;

forming inside the semiconductor body 10 an edge termination region 105, wherein forming the edge termination region 105 comprises:

forming a first doped semiconductor 103 region extending along the front side surface 10-1 and forming a continuous pn-junction J with the drift region 100, forming a further doped semiconductor region 106 in the semiconductor body 10, wherein the forming of the first doped semiconductor region 103 and the further doped semiconductor region 106 comprises the following steps:

forming a structured screening layer 3 on the front side 10-1, the structured screening layer 3 covering the first doped semiconductor region 103 to be formed, wherein the structured screening layer 3 is not present on the further doped semiconductor region 106 to be formed (however, it should be noted that a thin oxide 4 may be present on the further doped semiconductor region 106 to be formed);

implanting by means of a first mask 21, in a first implantation step, dopants through the structured screening layer 3 and into the semiconductor body 10 with a first implantation energy;

implanting by means of the first mask 21, in a further implantation step, dopants into the structured screening layer 3 and into the semiconductor body 10 with a second implantation energy that is lower than the first implantation energy;

wherein the first mask 21 is open above the further doped semiconductor region 106 to be formed, and wherein the first mask 21 defines first open areas and first masked areas, wherein in a cross-section along a horizontal direction X, Y, an area ratio of the open areas to the masked areas above the first semiconductor region 103 decreases (e.g. on average, i.e., not necessarily monotonously) in a direction pointing from an active region of the power semiconductor device 1 to a lateral edge of the semiconductor body 10.

In an embodiment, dopants implanted through the first mask 21 in the first step may have an implantation maximum located in the screening layer 3 above the first doped semiconductor region 103 to be formed. Further, in an embodiment, dopants implanted through the first mask 21 in said second implantation step may have an implantation maximum located in the first semiconductor region 103.

For example, the forming of the first and further doped semiconductor regions 103, 106 may further comprise performing at least one diffusion step to diffuse the dopants.

FIGS. 4A-E schematically and exemplarily illustrate an embodiment, wherein the same mask 21 is used for the first implantation (of dopants of the second conductivity type) and the second implantation (of dopants of the first conductivity type). The mask 21 may be a resist mask or a hard mask, for example. In case of a resist mask, no diffusion process can be applied between the first implantation and the second implantation. In this case two elements with different diffusion constants should be used as dopants (e.g. boron for the p-type and arsenic for the n-type), see FIGS. 4A-D.

For example, in an embodiment, the dopants of the first conductivity type may have a first diffusion constant in the semiconductor body 10 and the dopants of the second conductivity type may have a second diffusion constant in the semiconductor body 10, the second diffusion constant exceeding the first diffusion constant at least by a factor of 3.

In an embodiment, a diffusion length of the dopants of the first conductivity type is in a range of 30-70% of a diffusion length of the dopants of the second conductivity type. The diffusion length may be defined using a vertical doping profile. Then the diffusion length may be defined as the difference in depth of the location of the maximum of the doping profile and the location where the profile has reached a concentration with a value of the maximum divided bye (Euler's number e=2.718 . . . ).

For example, in an embodiment, a maximum structure size of the masks 21, 22 used for forming the first doped semiconductor region 103 is not larger than twice the diffusion length of the p-type dopants, such as not larger than 1.5 times the diffusion length of the p-type dopants.

Further, in an exemplary embodiment, the number of the n-type dopants implanted into the semiconductor body 10 is in a range of 10%-60% of the number of the p-type dopants implanted into the semiconductor body 10 in the first doped semiconductor region 103.

FIGS. 5A-D schematically and exemplarily illustrate a different embodiment, wherein two masks 21, 22 with different openings are used for the first and second implantation, respectively. Hence, the second mask 22 used for the second implantation may be different from the first mask 21 used for the first implantation. For example, the second mask 22 may have a smaller opening than the first mask 21, as illustrated. The second open area of the second mask 22 may thus lie completely within the first open area of the first mask 21. In these cases, two elements with similar diffusion constants (like boron and phosphorus) may be used as dopants implanted in the first and second implantation step, respectively, and they may be diffused by the same annealing process(es). See FIGS. 5A-D.

Accordingly, in an embodiment, the dopants of the first conductivity type may have a first diffusion constant in the semiconductor body 10 and the dopants of the second conductivity type may have a second diffusion constant in the semiconductor body 10, the second diffusion constant differing from the first diffusion constant at most by a factor in the range from 0.5 to 2. In other words, the respective diffusion constants of the dopants of the first conductivity type and of the dopants of the second conductivity may be similar, as in the case of, e.g., boron and phosphorous.

In an embodiment, as mentioned above, at the time of at least one of the two implantations a screening layer 3 may be present at the position of a mask opening. For example the screening layer 3 may comprise or consist of a thick oxide 3, wherein the thick oxide may have a thickness of, e.g., at least 400 nm and/or may be at least twice as thick at said position as at a different position. The implantation may be carried out through the thick oxide 3 with an energy high enough to penetrate the oxide layer 3. Other parts of the semiconductor body that are not covered by the thick oxide 3 may be covered by a thin oxide 4 or may not be covered by an oxide at all.

FIGS. 6-10 each schematically and exemplarily illustrate a section of a vertical cross-section of a power semiconductor device 1, such as, e.g., a diode, an IGBT, or a MOSFET, in accordance with one or more embodiments. In each case, the illustrated section comprises an edge termination region 105 (including a first doped semiconductor region 103 in the form of a VLD structure), which may have come into being by means of a method in accordance with one or more of the embodiments described above. Hence, what has been stated above with reference to variants of a method of producing a power semiconductor device 1 may analogously apply to the embodiments of a power semiconductor device 1 of FIGS. 6-10, and vice versa.

Figure 6:
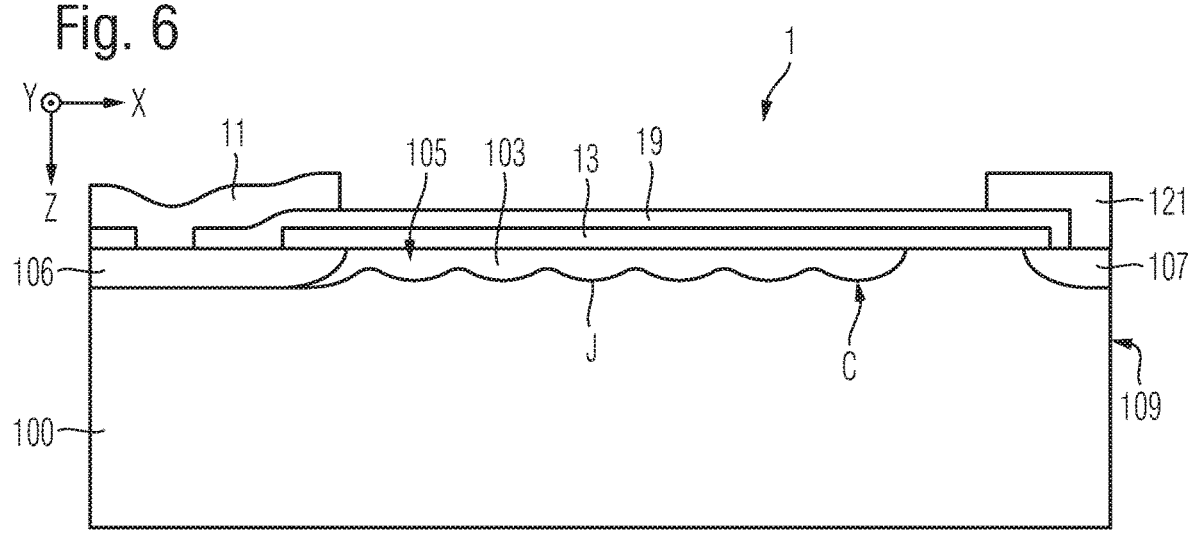
FIG. 6 schematically and exemplarily illustrates a section of a vertical cross-section of a power semiconductor device in accordance with one or more embodiments.

For example, in accordance with FIG. 6, the power semiconductor device 1 may comprise said first doped semiconductor region 103 in the form of a VLD edge termination region 103, as described above. It should be noted that the second doped semiconductor regions 104 described above are not separately shown in FIG. 6. Where the VLD edge termination region 103 extends along the front side surface 10-1 of the semiconductor body 10, the front side surface 10-1 is covered by one or more insulating layers 13, 19.

On the left side of FIG. 6, the illustrated cross-section of the power semiconductor device 1 shows a portion of a deep p-well 106 that is electrically connected with a front side metallization 11. The front side metallization 11 may form a part of a first load terminal structure of the power semiconductor device 1.

Figure 9:
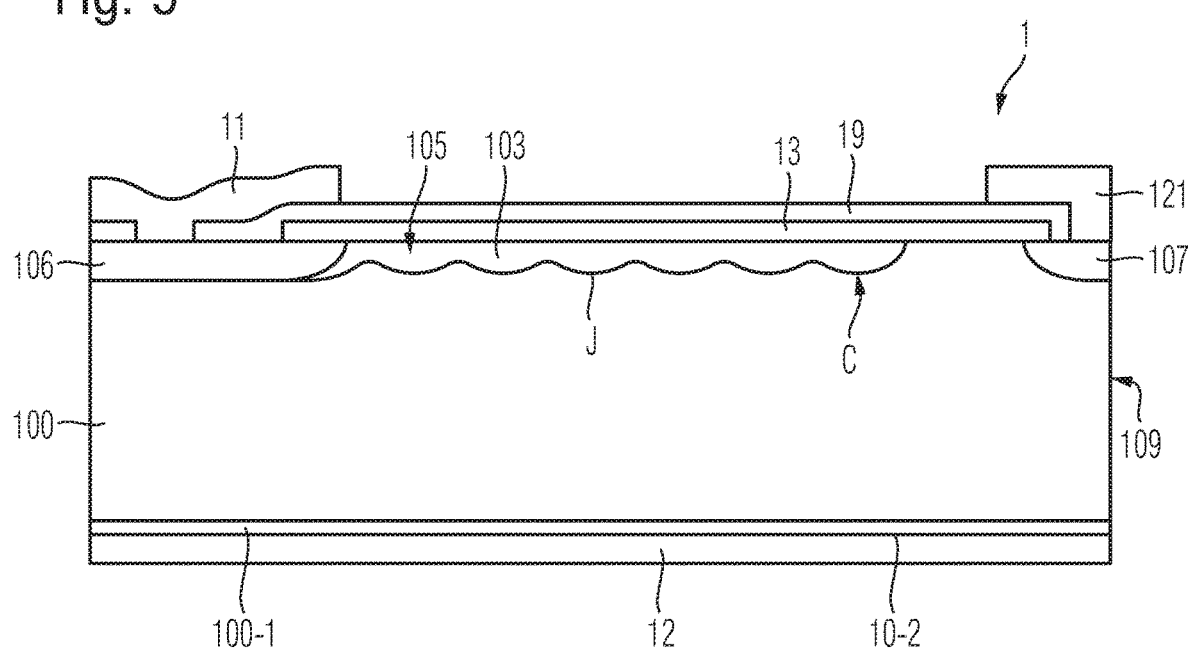
FIG. 9 schematically and exemplarily illustrates a section of a vertical cross-section of a power semiconductor device in accordance with one or more embodiments.

As shown on the right side of FIG. 6, a channel stopper region 107 may be additionally included in the semiconductor body 10. The channel stopper region 107 may have dopants of the second conductivity type and may be in contact with a channel stopper electrode 121, as illustrated. Alternatively, the channel stopper region 107 may have dopants of the first conductivity type, as illustrated in FIG. 9.

Regarding the rippled contour C of the VLD region 103, it should be noted that the illustration in FIG. 6 is not to scale. For example, in a real embodiment, the rippled structure may be much finer than the one that is only schematically depicted in FIG. 6.

For example, the VLD region 103 may have a higher mean dopant dose near an active region of the power semiconductor device 1 (i.e., to the left in FIG. 6) than at a position further to the chip edge (i.e., to the right in FIG. 6).

Figure 7:
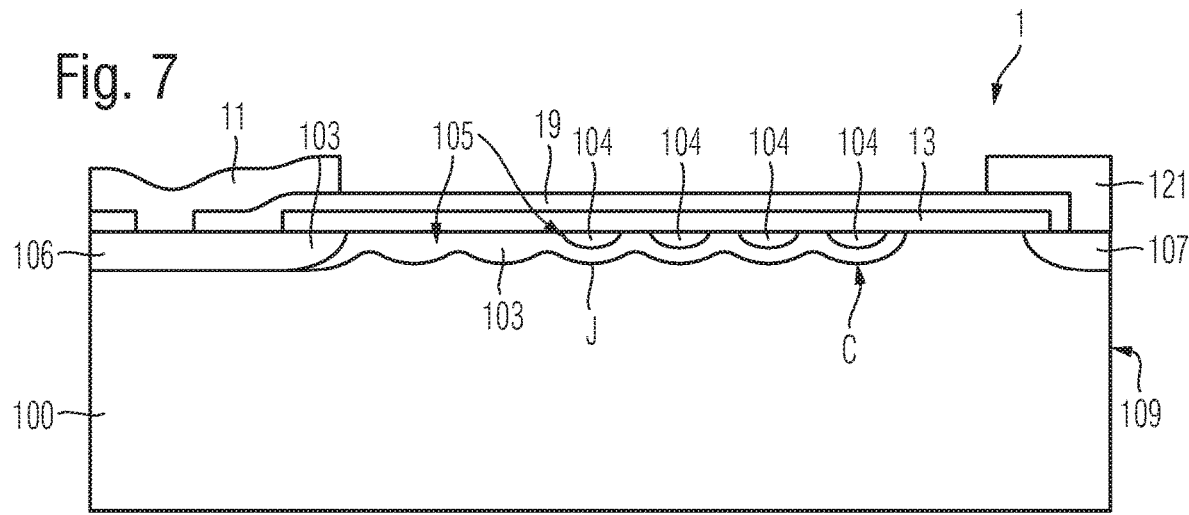
FIG. 7 schematically and exemplarily illustrates a section of a vertical cross-section of a power semiconductor device in accordance with one or more embodiments.

FIG. 7 schematically and exemplarily illustrates another variant of a VLD region 103 that may have been produced using the above-described method. In this case, the second doped semiconductor regions 104 (which may be predominantly n-doped), are explicitly shown inside the first doped semiconductor region 103. It should be noted that the compensating implantation may be used only in a part of the VLD region 103. For example, during the second implantation, the front side surface 10-1 may be masked completely, e.g., in an inner part of the VLD region 103, i.e., near an active region of the power semiconductor device 1 (to the left in FIG. 7).

Figure 8:
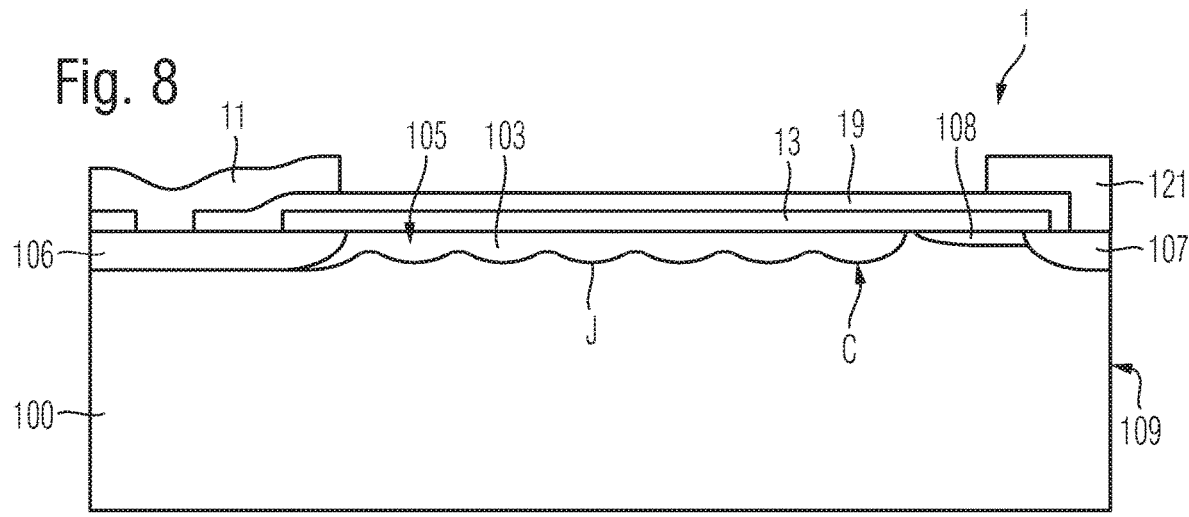
FIG. 8 schematically and exemplarily illustrates a section of a vertical cross-section of a power semiconductor device in accordance with one or more embodiments.

FIG. 8 schematically and exemplarily illustrates yet another cross-section of a power semiconductor device 1 including a VLD region 103, which may have been produced (including the not shown second doped semiconductor regions 104) using the above-described method. For example, the mask 22 used for the (n-type) second implantation (e.g., phosphorus or arsenic) may also be used for an n-implant 108 at the outer side of the edge termination that may serve to prevent a too wide extension of the space charge region during a blocking state of the power semiconductor device 1.

FIG. 9 schematically and exemplarily illustrates a further cross-section of a power semiconductor device 1 including a VLD region 103, which may have been produced using the above-described method. In this case, the depicted section of the vertical cross-section also includes a backside of the power semiconductor device 1. For example, a backside metallization 12 is arranged at a backside surface 10-2 of the semiconductor body 10. The backside metallization 12 may form at least a part of a second load terminal structure of the power semiconductor device 1. Further, a backside emitter region 100-1 may be arranged at the backside in contact with the backside metallization 12. The backside emitter region 100-1 may comprise dopants at a higher concentration than the drift region 100. For example, the power semiconductor device 1 may be or comprise a power diode, in which case the backside emitter region 100-1 may be of the first conductivity type (e.g., n-type).

FIG. 10 schematically and exemplarily illustrates a further cross-section of a power semiconductor device 1 including a VLD region 103, which may have been formed using the above-described method. In this case, the illustrated section includes, in addition to an edge region 15, also a peripheral part of an active region 14 of the power semiconductor device 1 (to the left in FIG. 10). The active region 14 may comprise an active cell field comprising a plurality of transistor cells 140. For example, the transistor cells 140 may have a trench gate configuration, as illustrated. Further, an insulation structure 190 may be provided. The design of such transistor cells 140 is in principle well known to those skilled in the art and will therefore not be described in further detail here.

For example, the power semiconductor device may have an IGBT configuration. In that case, the backside emitter region 100-1 may be of the second conductivity type. Alternatively, for example, the power semiconductor device 1 may have a MOSFET configuration, in which case the backside emitter region 100-1 may be of the first conductivity type.

Summarizing with regard to FIGS. 9 and 10, it should be noted that the edge termination region 103 (e.g. in the form of a VLD region) may belong to an edge termination structure of a diode (cf. e.g. FIG. 9) or of an IGBT (cf. e.g. FIG. 10) or of another high-voltage device.

FIGS. 11A-E each schematically and exemplarily illustrate a section of an implantation mask 21, 22 which may be used in the above-described method in accordance with one or more embodiments. The shaded areas represent portions where the mask 21, 22 covers the front side surface 10-1. Conversely, the white areas in between said shaded areas remain free, such that dopants may be implanted in the white areas.

As illustrated, a variety of shapes may be used for structuring the masks 21, such as, e. g., squares, boxes or hexagons. These shapes may correspond either to covered areas (see FIGS. 11A, 11B, 11D) or to areas that are left free for implantation (see FIGS. 11C, 11E).

Figure 11A:
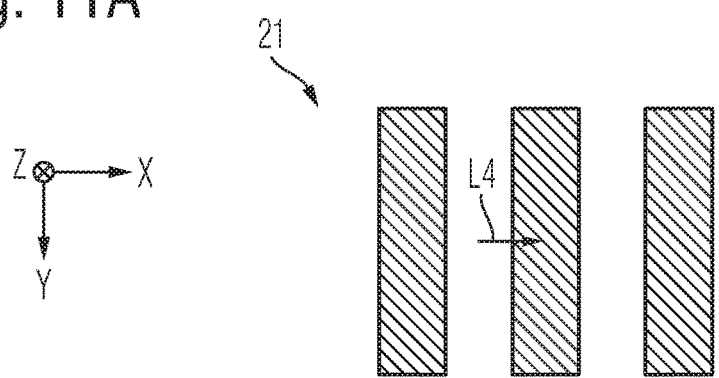
FIGS. 11A-E each schematically and exemplarily illustrate a section of an implantation mask used in a method in accordance with one or more embodiments.
Figure 11B:
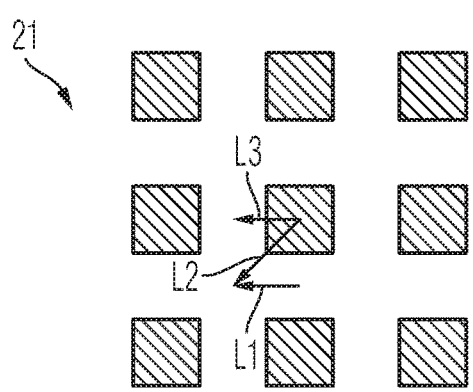
Figure 11C:
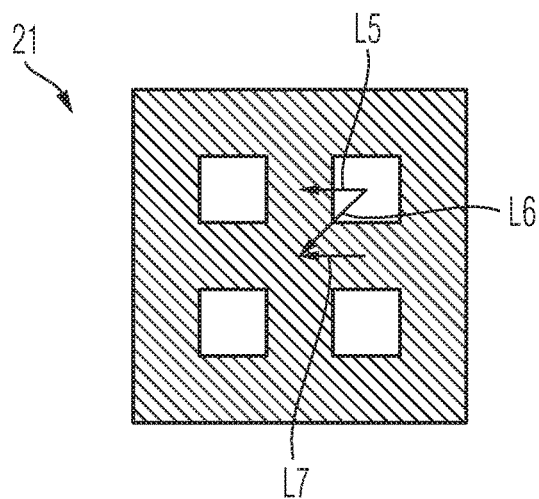
Figure 11D:
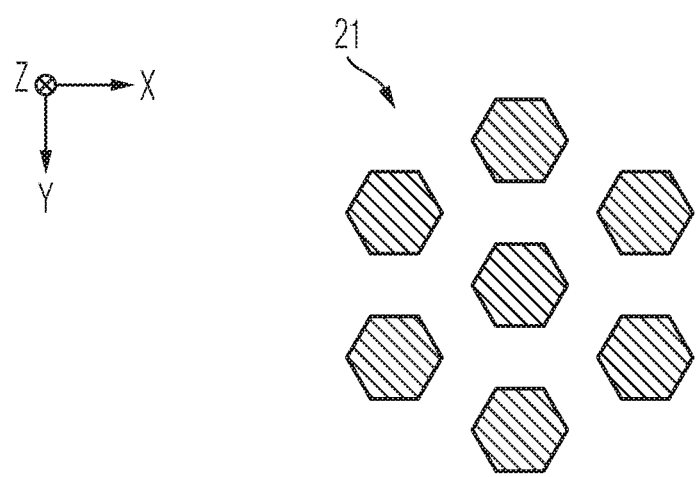
Figure 11E:
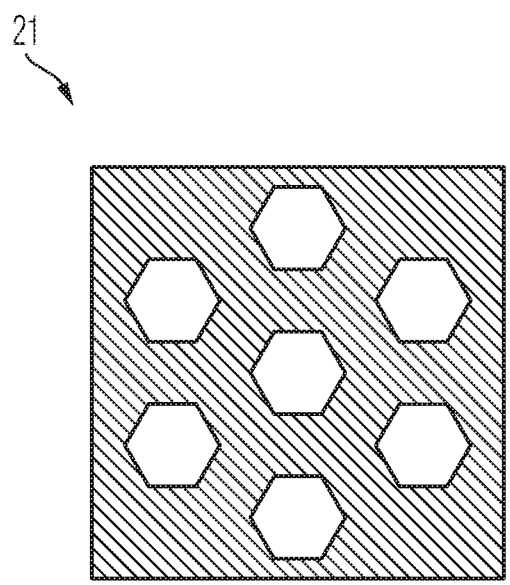
Figure 12A:
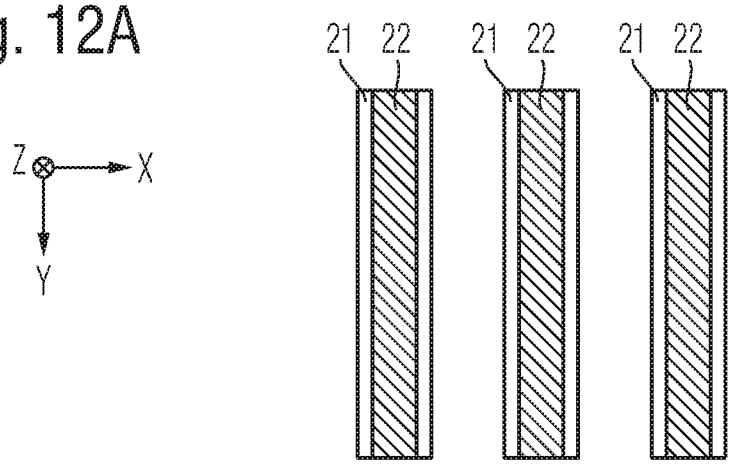
Figure 12B:
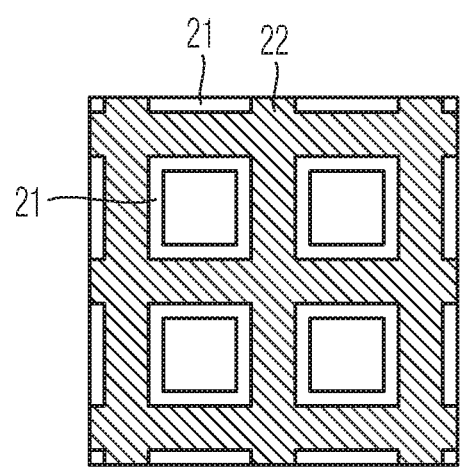
Figure 12C:
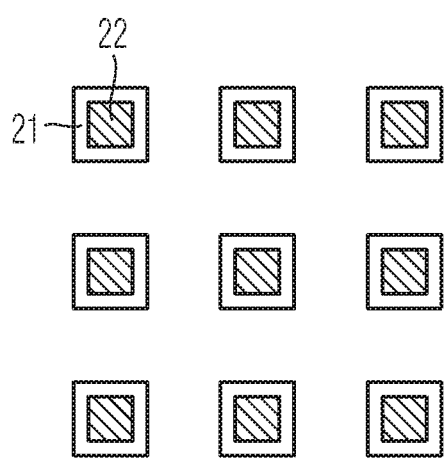

In the examples of FIGS. 11A-C, the open area is 50%/75%/25% of the total area, respectively. These numbers of course may be changed by choosing different sizes of the structures and/or a different pitch.

In FIGS. 11A-C, arrows L1-L7 indicate the paths over which a respective dopant dose (i.e., a dopant concentration vertically integrated with respect to the depth below the front-side surface 10-1) are shown in FIGS. 13-16, as will be explained further below.

It should be noted that, while the depicted mask layouts in FIGS. 11A-E are exemplarily marked with the reference numeral of the first mask 21, also the second mask 22 may exhibit such forms.

FIGS. 12A-E each schematically and exemplarily illustrate a section of two different implantation masks 21, 22 used in a method in accordance with one or more embodiments. For example, the shaded areas correspond to open areas of the second mask 22, i.e., areas where the dopants of the first conductivity type (e.g., n-type) are implanted in the second implantation step. The non-shaded areas mark outer contours of open areas of the first mask 21, i.e., areas where dopants of the second conductivity type (e.g., p-type) are implanted in the first masked implantation.

It should be noted that the non-shaded areas in FIGS. 12A-E may also extend below the shaded areas. In other words, the open areas of the first mask 21 may be larger than the open areas of the second mask 22, wherein the latter may be entirely arranged inside the former. In other words, in an embodiment, the first mask 21 may be open everywhere where the second mask 22 is open.

For example, in case the second mask 22 used for the second implantation is different from the first mask 21 used for the first implantation, the second mask 22 may be related in a certain way to the first mask 21, e. g. by exhibiting in principle a similar shape, however with openings being smaller by a certain amount as compared to the openings of the first mask 21.

FIGS. 13-16 each schematically and exemplarily illustrate several lateral profiles of implantation doses in accordance with one or more embodiments. In each case, vertically integrated dopant doses in the first doped semiconductor region 103 are shown along the different paths (arrows) L1-L7 indicated in FIGS. 11A-C.

In each of FIGS. 13-16, the curves C1, C2, C3 belong to a mask pattern according to FIG. 11B (masked squares; 75% open area). Curve C1 corresponds to the horizontal path L1 in FIG. 11B (entirely inside an open area of the mask). Curve C2 corresponds to the diagonal path L2 in FIG. 11B (partially inside an open area and inside a masked area). Curve C3 corresponds to the horizontal path L3 in FIG. 11B (partially inside an open area and inside a masked area).

Further, in each of FIGS. 13-16, the curve C4 belongs to a mask pattern according to FIG. 11A (implanted elongate boxes, 50% open area), wherein curve C4 corresponds to the horizontal path L4 (partially inside an open area and inside a masked area).

The curves C5, C6, C7 belong in each case to a mask pattern according to FIG. 11C (open/implanted squares; 25% open area). Curve C7 corresponds to the horizontal path L7 in FIG. 11C (entirely inside a masked area). Curve C6 corresponds to the diagonal path L6 in FIG. 11C (partially inside an open area and inside a masked area). Curve C5 corresponds to the horizontal path L5 in FIG. 11C (partially inside an open area and inside a masked area).

Figure 13:
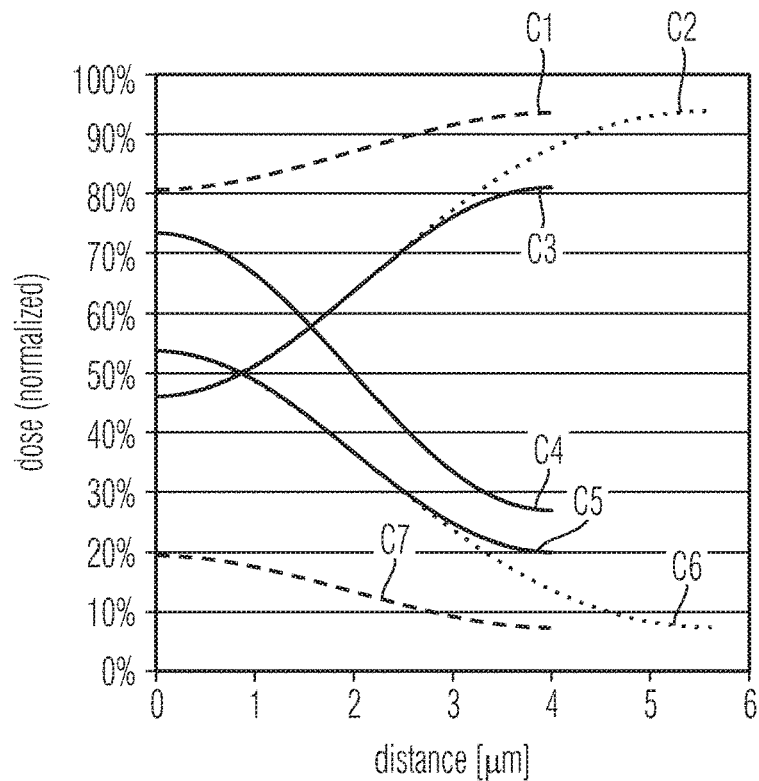
FIG. 13 schematically and exemplarily illustrates lateral profiles of doping doses (after diffusion) in accordance with one or more embodiments.

FIG. 13 shows the dose profiles C1-C7 for the three different mask patterns according to FIGS. 11A-C in absence of a compensating n-implant, i.e., without the second implantation described above. The doses are shown for mask patterns with a structure size of 4 µm and assuming a diffusion length of 2.55 µm. The doses are normalized to the value corresponding to 100% open area. It can be seen that the doses deviate very strongly from respectively intended mean values (corresponding to the 75%, 50%, and 25% open mask area mentioned above).

Figure 14:
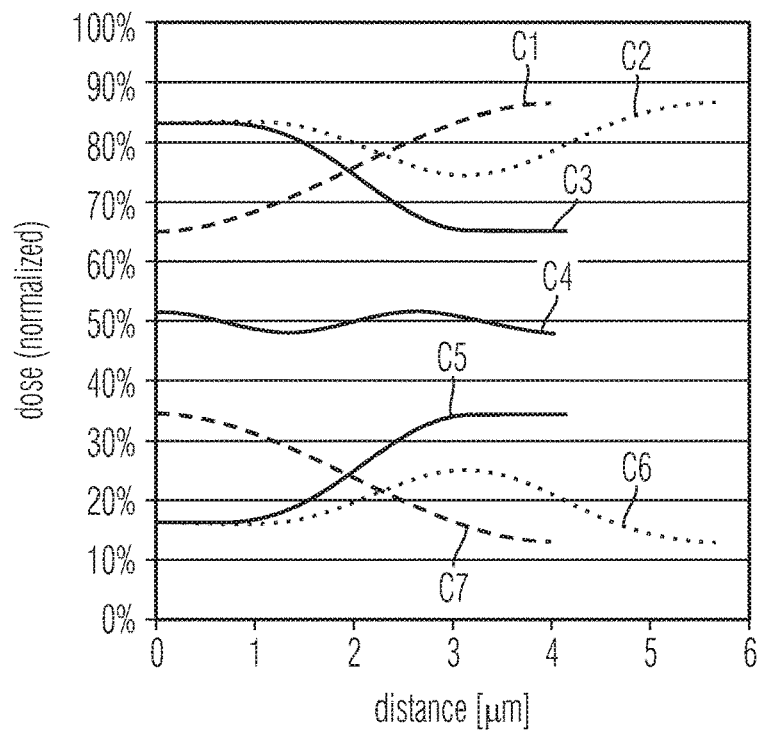
FIG. 14 schematically and exemplarily illustrates lateral profiles of net doping doses (after diffusion) in accordance with one or more embodiments.

For comparison, FIG. 14 shows the dose profiles C1-C7 resulting from the same structure size of the respective mask patterns with a compensating n-implant according to the invention, wherein the same diffusion length as above is assumed for the p-dopants and a smaller diffusion length is assumed for the n-dopants. As a result of the compensating n-implant, the deviations are considerably smaller. For these cases, the difference of p-dose and n-dose (i.e., the resulting net dose) is shown.

Figure 15:
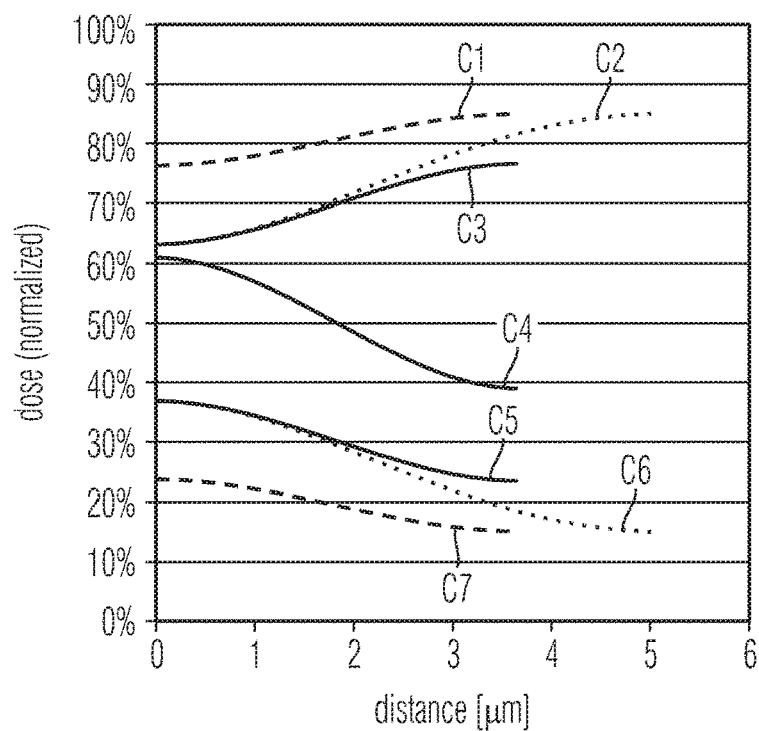
FIG. 15 schematically and exemplarily illustrates lateral profiles of net doping doses (after diffusion) in accordance with one or more embodiments.

FIG. 15 shows the dose profiles C1-C7 for the three different mask patterns again in absence of a compensating n-implant (as in FIG. 13), but this time with a smaller structure size of 3 µm and assuming the same diffusion length as above. It can be seen that for a smaller structure size the lateral profiles are much more homogeneous.

Figure 16:
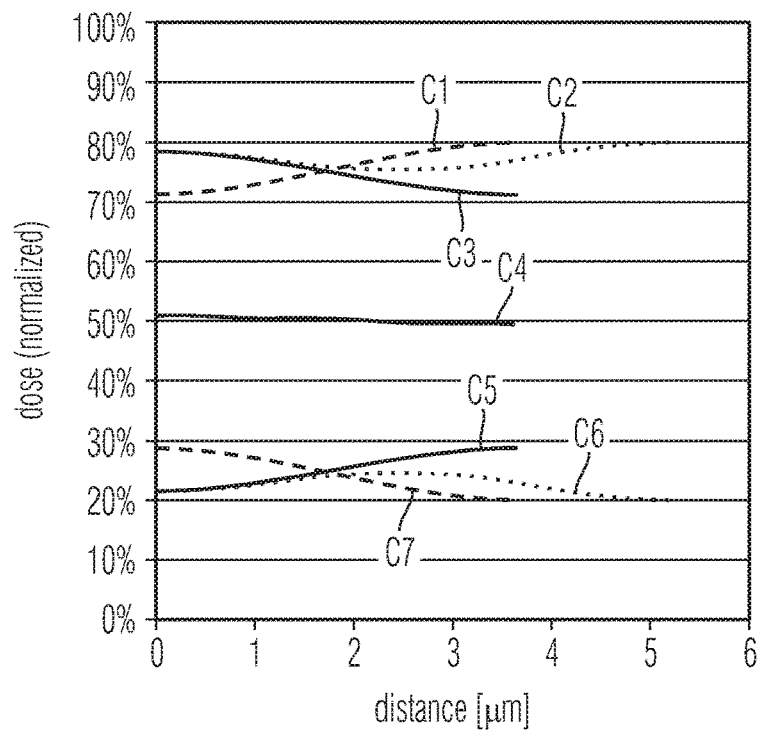
FIG. 16 schematically and exemplarily illustrates lateral profiles of net doping doses (after diffusion) in accordance with one or more embodiments.

FIG. 16 shows, for comparison, the case with an n-implant compensation (assuming the same structure size as in FIG. 15 and the same diffusion length as in FIG. 14). Since the profile is already more homogeneous without compensation (see FIG. 15), the dose needed for a further homogenization is lower. Also here, a strong improvement can be seen with compensation.

Figure 17A:
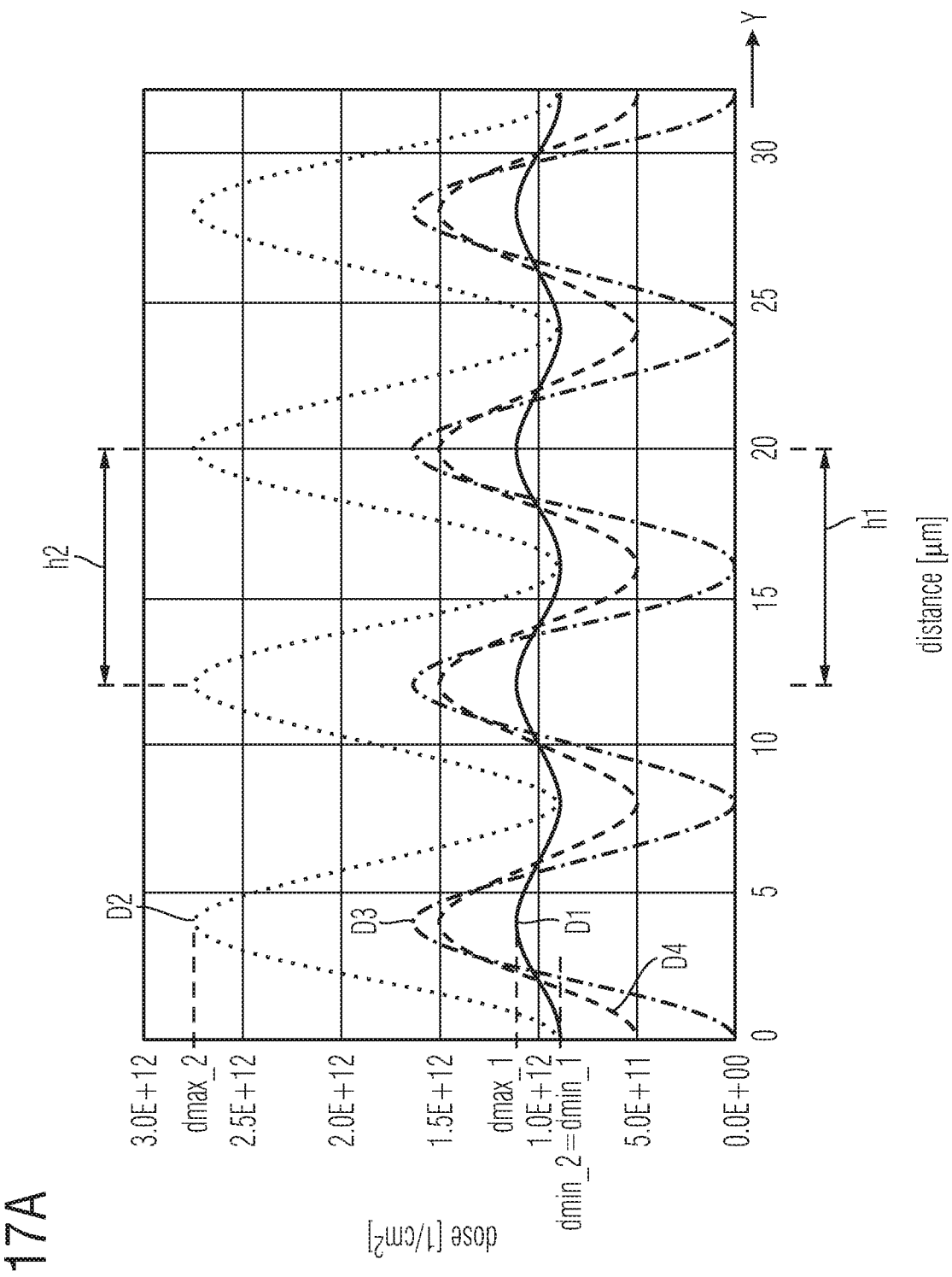
Figure 17C:
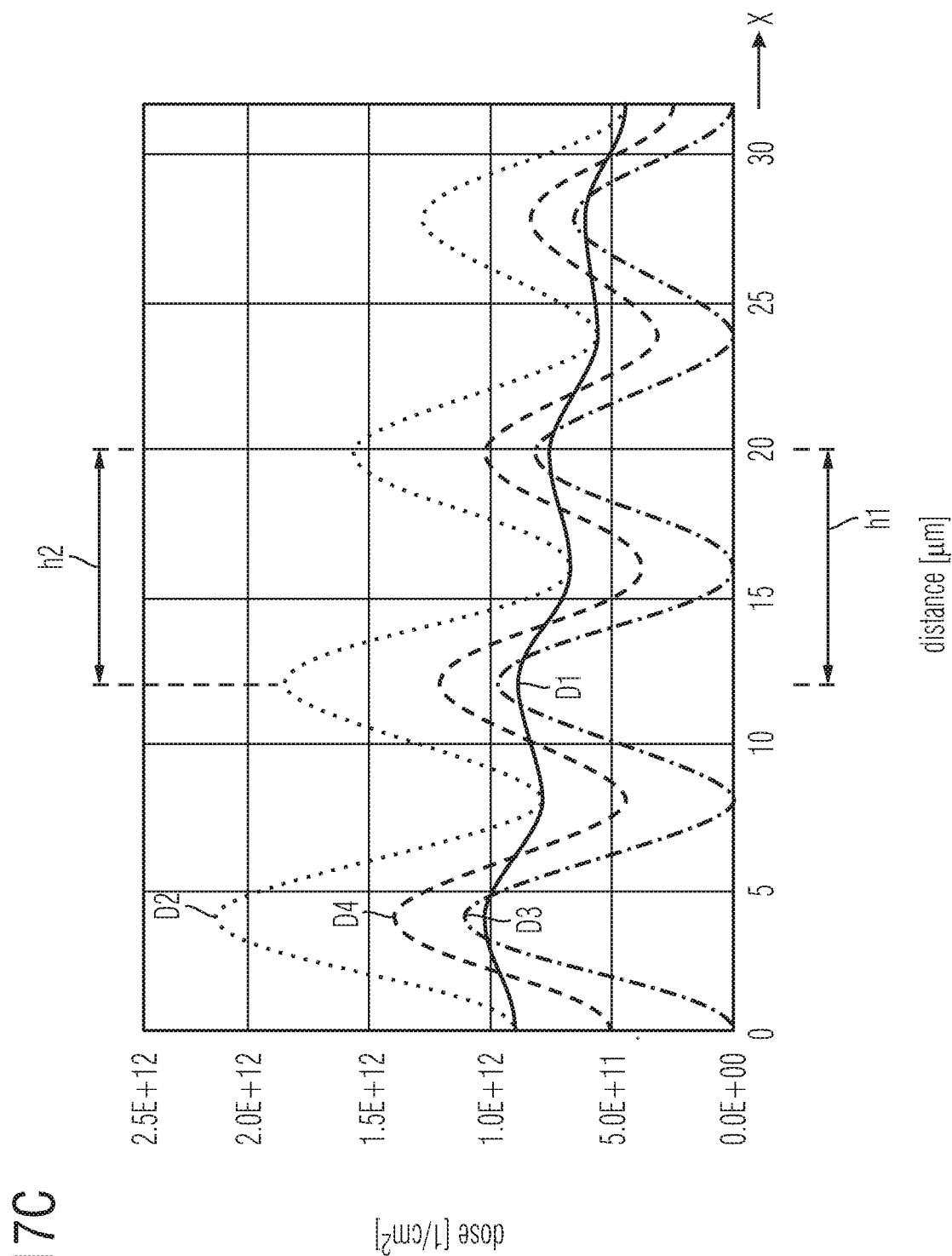

FIGS. 17A-C each schematically and exemplarily illustrate lateral profiles of vertically implantation doses in the first doped semiconductor region 103 in accordance with one or more embodiments. In each case, the dotted curve D_2 is a dose profile of acceptors, which may have been implanted in the first masked implantation. The dash-dotted curve D_3 is a dose profile of donors, which may have been implanted in the (compensating) second implantation step. The solid curve D_1 is a resulting net dose curve, i.e., a difference of the dose curves D_2 and D_3. The dashed curve D_4 is a reference dose profile (resulting from a conventional process without a compensating n-implant). The dose profiles D1-D4 exhibit in each case a certain waviness (or ripple) and are depicted over several periods.

The example illustrated in FIG. 17A shows a very strong reduction of the ripple. As can clearly be seen, the first dose profile D_1 representing the vertically integrated net dopant concentration (i.e., the net dose) of the dopants of the first and second conductivity types in the first doped semiconductor region 103 exhibits a smaller degree of waviness along a horizontal direction X, Y (e.g., the horizontal direction of the vertical cross-section mentioned above) than the second dose profile D_2 representing a vertically integrated dopant concentration of the dopants of (only) the second conductivity type in the first doped semiconductor region 103.

For example, in an embodiment, a relative ripple amplitude Ar_1 of the first dose profile D_1 amounts to at most 80% (such as at most 70%) of a relative ripple amplitude Ar_2 of the second dose profile D_2, the relative ripple amplitude Ar_i (i=1, 2) being defined as $$Ar\_i=(dmax\_i-dmin\_i)/(dmax\_i+dmin\_i),$$

where i=1, 2, dmax_i is a dose value at a local maximum of the dose profile D_i, and dmin_i is a dose value at a neighboring local minimum of the dose profile D_i. For example, the relative ripple amplitude may thus be reduced, by means of the compensating implantation according to the invention, from a value of Ar_2=50% to a value of at most Ar_1=35%, such as to a value of Ar_1=30% or even to a value of Ar_1=10%.

Further, in an embodiment, an averaged relative ripple amplitude <Ar_1> of the first dose profile D_1 amounts to at most 80% of an averaged relative ripple amplitude <Ar_2> of the second dose profile D_2, wherein the average is taken over a section of the first dose profile D_1 and a corresponding section of the second dose profile D_2, respectively, said sections comprising in each case at least 2 local maxima and a local minimum arranged there between.

Further, in an embodiment, an averaged relative ripple amplitude <Ar_1> of the first dose profile D_1 amounts to at most 80% of an averaged relative ripple amplitude <Ar_2> of the second dose profile D_2, wherein the average is taken over a section of the first dose profile D_1 and a corresponding section of the second dose profile D_2, respectively, said sections comprising in each case at least 5 local maxima and neighboring local minima.

Further, in an embodiment, a relative ripple amplitude Ar_2 of the second dose profile D_2 amounts to at least 0.5, the relative ripple amplitude being defined as the relative ripple amplitude Ar_2 of the second dose profile D_2 being defined as $$Ar\_2=(dmax\_2-dmin\_2)/(dmax\_2+dmin\_2),$$

wherein dmax_2 is a dose value at a local maximum of the second dose profile D_2 and dmin_2 is a dose value at a neighboring local minimum of the second dose profile D_2.

Further, in an embodiment, an averaged relative ripple amplitude <Ar_2> of the second dose profile D_2 amounts to at least 0.5, wherein the average is taken over a section of the second dose profile D_2, the section comprising at least 5, such as at least 10, local maxima and neighboring local minima.

In the example of FIG. 17A, each of the reference dose profile D_4 and the second dose profile D_2 have a relative ripple amplitude of 50% (Ar_2=0.5), whereas the dose profile according to the invention (curve D_1) has a relative ripple amplitude of only 10% (Ar_1=0.1).

FIG. 17B shows an example with an only moderate reduction of the ripple: Here, the resulting relative ripple amplitude of the curve D_1 is A_1=0.3 or 30%.

The examples of FIGS. 17A-B refer to the case where the ripple is in a direction Y in which the mean dose does not vary, e.g., parallel to a chip edge in a linear part of the edge termination structure (e. g., perpendicular to the two-dimensional cuts of FIGS. 6-10). In a direction corresponding to, e. g., the lateral direction X in FIGS. 6-10, the profile will decrease towards the chip edge, as schematically shown in FIG. 17C.

In an embodiment in accordance with each of the examples of FIGS. 17A-C, neighboring local maxima of the first dose profile D_1 may be spaced apart from one another at least by a first horizontal distance h1 amounting to at least 2 μm. Additionally or alternatively, in an embodiment, neighboring local maxima of the second dose profile D_2 may be spaced apart from one another at least by a second horizontal distance h2 amounting to at least 2 μm.

Figure 18A:
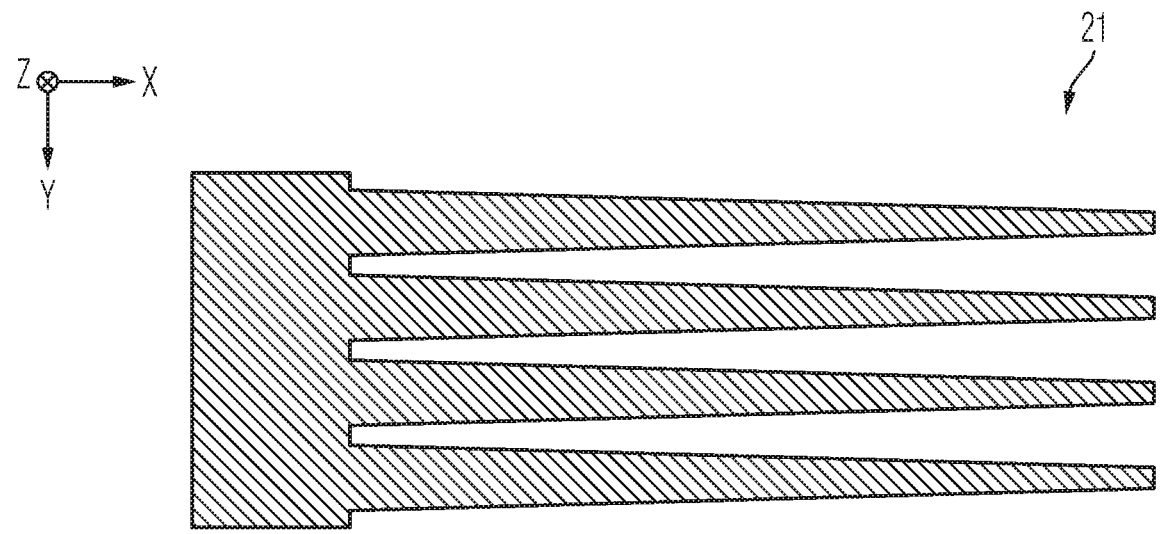
FIGS. 18A-C each schematically and exemplarily illustrate a section of an implantation mask used in a method in accordance with one or more embodiments.
Figure 18B:
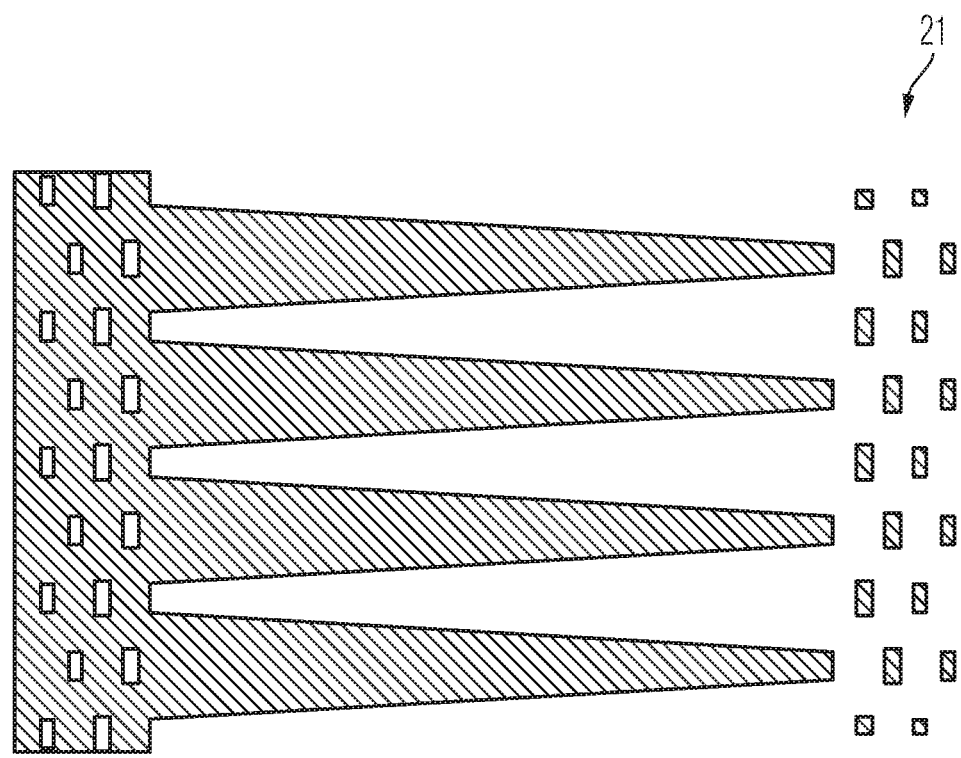
Figure 18C:
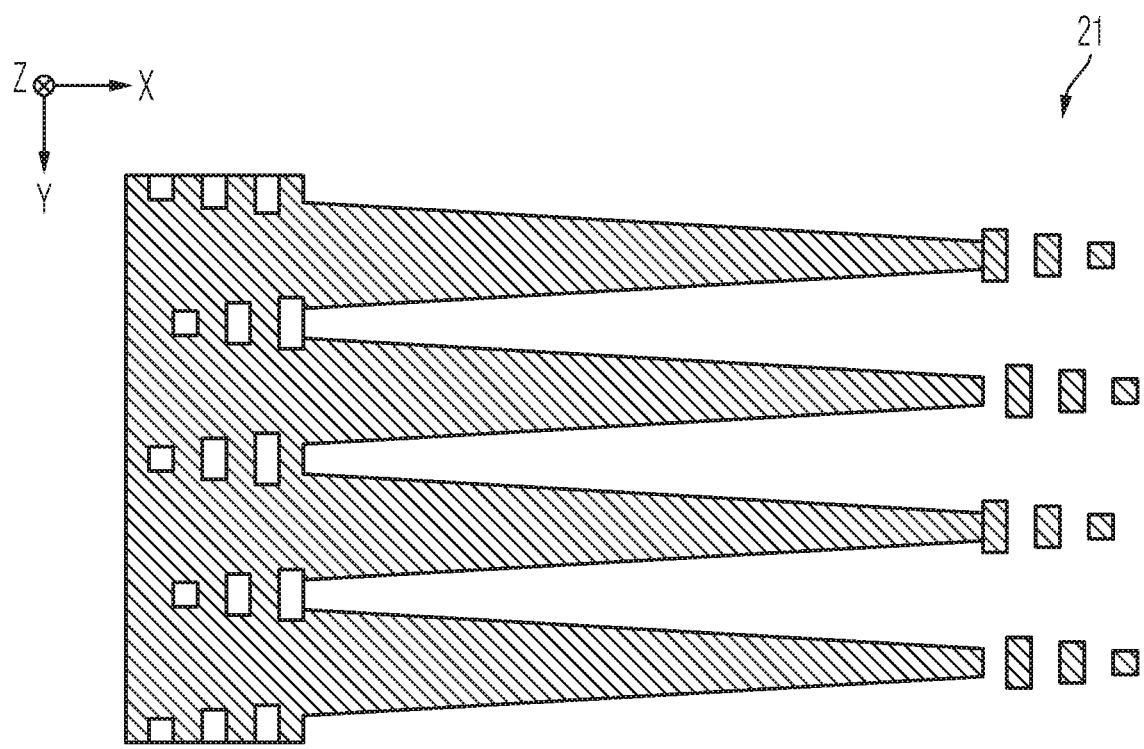

FIGS. 18A-C each schematically and exemplarily illustrate a section of a VLD-type implantation pattern that may be used in a method in accordance with one or more embodiments. The illustrated closed areas are regions where doping elements are implanted (i.e., openings of the first mask 21 and/or of the second mask 22, for example). For example, in FIGS. 18A-C, the chip edge is to the right (i. e., located further in the direction x), and the active area of the power semiconductor device 1 is to the left. The doping doses of FIGS. 17A-B may correspond to a path along the second horizontal direction Y, wherein the dopant profile may have been produced according to the pattern shown in FIG. 18A, for example.

Two further examples showing a combination of a longitudinal stripe pattern for a medium range of effective doses and patterns of rectangular openings and mask structures for the low and high doses are illustrated in FIGS. 18B and 18C, respectively.

For example, in accordance with the patterns of FIGS. 18A-C, in a cross-section along the second horizontal direction Y, an area ratio of the open areas of the first mask 21 to the masked areas of the first mask 21 above the first semiconductor region 103 may decrease (e.g. on average, i.e., not necessarily monotonously) in a direction pointing from an active region of the power semiconductor device 1 to a lateral edge of the semiconductor body 10. For example, in some embodiments, such a decrease may occur along both the first and second horizontal directions X, Y.

In the above, embodiments pertaining to power semiconductor devices and corresponding processing methods were explained.

For example, these semiconductor devices are based on silicon (Si). Accordingly, a monocrystalline semiconductor region or layer, e.g., the semiconductor body 10 and its regions/zones, e.g., regions etc. can be a monocrystalline Si-region or Si-layer. In other embodiments, polycrystalline or amorphous silicon may be employed.

It should, however, be understood that the semiconductor body 10 and its regions/zones can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe) to name few. The aforementioned semiconductor materials are also referred to as "homojunction semiconductor materials". When combining two different semiconductor materials a heterojunction semiconductor material is formed. Examples of heterojunction semiconductor materials include, without being limited thereto, aluminum gallium nitride (AlGaN)-aluminum gallium indium nitride (AlGaInN), indium gallium nitride (InGaN)-aluminum gallium indium nitride (AlGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide (SixC1-x) and silicon-SiGe heterojunction semiconductor materials. For power semiconductor switches applications currently mainly Si, SiC, GaAs and GaN materials are used.

Spatially relative terms such as "under", "below", "lower", "over", "upper" and the like, are used for ease of description to explain the positioning of one element relative to a second element. These terms are intended to encompass different orientations of the respective device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising", "exhibiting" and the like are open ended terms that indicate the presence of stated elements or features, but do not preclude additional elements or features.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A power semiconductor device, comprising:
    a semiconductor body having a front side surface and including a drift region having dopants of a first conductivity type;
    an edge termination region included in the semiconductor body and comprising:
        a part of the drift region; and
        a first semiconductor region extending along the front side surface,
    wherein the first semiconductor region comprises dopants of the first conductivity type and dopants of a second conductivity type complementary to the first conductivity type,
    wherein an integrated vertical dopant concentration of the dopants of the second conductivity type is higher than an integrated vertical dopant concentration of dopants of the first conductivity type within the first semiconductor region, the first semiconductor region forming a continuous pn-junction with the drift region,
    wherein a first dose profile representing a vertically integrated net dopant concentration of the dopants of the first and second conductivity types in the first doped semiconductor region has a smaller degree of waviness along a horizontal direction than a second dose profile representing a vertically integrated dopant concentration of the dopants of the second conductivity type in the first doped semiconductor region.

2. The power semiconductor device of claim 1, wherein a relative ripple amplitude $Ar\_1$ of the first dose profile $D\_1$ amounts to at most 80% of a relative ripple amplitude $Ar\_2$ of the second dose profile $D\_2$, the relative ripple amplitude $Ar\_i$ (i=1, 2) being defined as $$Ar\_i=(d\max\_i-d\min\_i)/(d\max\_i+d\min\_i),$$

where i=1, 2, $d\max\_i$ is a dose value at a local maximum of the dose profile $D\_i$, and $d\min\_i$ is a dose value at a neighboring local minimum of the dose profile $D\_i$.

3. The power semiconductor device of claim 2, wherein an averaged relative ripple amplitude $<Ar\_1>$ of the first dose profile $D\_1$ amounts to at most 80% of an averaged relative ripple amplitude $<Ar\_2>$ of the second dose profile $D\_2$, wherein the average is taken over a section of the first dose profile $D\_1$ and a corresponding section of the second dose profile $D\_2$, respectively, said sections comprising in each case at least 2 local maxima and a local minimum arranged there between.

4. The power semiconductor device of claim 2, wherein an averaged relative ripple amplitude $<Ar\_1>$ of the first dose profile $D\_1$ amounts to at most 80% of an averaged relative ripple amplitude $<Ar\_2>$ of the second dose profile $D\_2$, wherein the average is taken over a section of the first dose profile $D\_1$ and a corresponding section of the second dose profile $D\_2$, respectively, said sections comprising in each case at least 5 local maxima and neighboring local minima.

5. The power semiconductor device of claim 1, wherein a relative ripple amplitude $Ar\_2$ of the second dose profile $D\_2$ amounts to at least 0.5, the relative ripple amplitude being defined as the relative ripple amplitude $Ar\_2$ of the second dose profile $D\_2$ being defined as $$Ar\_2=(d\max\_2-d\min\_2)/(d\max\_2+d\min\_2),$$

where $d\max\_2$ is a dose value at a local maximum of the second dose profile $D\_2$ and $d\min\_2$ is a dose value at a neighboring local minimum of the second dose profile $D\_2$.

6. The power semiconductor device of claim 5, wherein an averaged relative ripple amplitude $<Ar\_2>$ of the second dose profile $D\_2$ amounts to at least 0.5, wherein the average is taken over a section of the second dose profile $D\_2$, the section comprising at least 5 local maxima and neighboring local minima.

7. The power semiconductor device of claim 1, wherein the edge termination region forms at least a part of a variation-of-lateral-doping edge termination region.

8. The power semiconductor device of claim 1, wherein:
    neighboring local maxima of the first dose profile are spaced apart from one another at least by a first horizontal distance amounting to at least 2 μm; and/or
    neighboring local maxima of the second dose profile are spaced apart from one another at least by a second horizontal distance amounting to at least 2 μm.

9. A method of processing a power semiconductor device, the method comprising:
    providing a semiconductor body having a front side surface and including a drift region having dopants of a first conductivity type; and
    forming inside the semiconductor body an edge termination region,
    wherein forming the edge termination region comprises forming a first doped semiconductor region extending along the front side surface and forming a continuous pn-junction with the drift region,
    wherein forming the first doped semiconductor region comprises:
        implanting dopants of a second conductivity type through the front side surface by means of a first masked implantation, wherein a first mask is used for the first masked implantation, the first mask defining first open areas and first masked areas; and implanting dopants of a first conductivity type through the front side surface by means of a second masked implantation, wherein a second mask is used for the second masked implantation, the second mask defining second open areas and second masked areas, wherein the first mask and the second mask are arranged on the semiconductor body such that open areas of the second mask overlaying the first doped semiconductor region during the second implantation step horizontally overlap with open areas of the first mask overlaying the first doped semiconductor region during the first masked implantation, wherein the first mask and the second mask are arranged on the semiconductor body such that closed areas of the second mask overlaying the first doped semiconductor region during the second implantation step horizontally overlap with closed areas of the first mask overlaying the first doped semiconductor region during the first masked implantation.

10. The method of claim 9, wherein in a cross-section along a horizontal direction, an area ratio of the open areas of the first mask to the masked areas of the first mask above the first semiconductor region decreases in a direction pointing from an active region of the power semiconductor device to a lateral edge of the semiconductor body.

11. The method of claim 10, wherein forming the first doped semiconductor region comprises performing at least one diffusion step to diffuse the dopants of the second conductivity type.

12. The method of claim 11, wherein the at least one diffusion step is carried out before the implantation of dopants of the first conductivity type.

13. The method of claim 9, wherein forming the first doped semiconductor region comprises diffusing the implanted dopants of the first conductivity type and the implanted dopants of the second conductivity type in a same diffusion step.

14. The method of claim 9, wherein the first semiconductor region is formed such that a first dose profile representing a vertically integrated net dopant concentration of the dopants of the first and second conductivity types in the first doped semiconductor region has a smaller degree of waviness along a horizontal direction than a second dose profile representing a vertically integrated dopant concentration of the dopants of the second conductivity type in the first doped semiconductor region.

15. The method of claim 9, wherein a same mask is used for the first masked implantation and the second masked implantation.

16. The method of claim 9, wherein the dopants of the first conductivity type have a first diffusion constant in the semiconductor body, and wherein the dopants of the second conductivity type have a second diffusion constant in the semiconductor body, the second diffusion constant differing from the first diffusion constant at most by a factor in a range from 0.5 to 2.

17. The method of claim 9, wherein the dopants of the first conductivity type have a first diffusion constant in the semiconductor body, and wherein the dopants of the second conductivity type have a second diffusion constant in the semiconductor body, the second diffusion constant exceeding the first diffusion constant at least by a factor of 3.

18. The method of claim 9, wherein the dopants of the first conductivity type and/or the dopants of the second conductivity type are implanted through a screening layer that is arranged above the front side surface, the method further comprising:

forming, by means of a third implantation of dopants of the first or second conductivity type through the front side surface, a third doped semiconductor region extending along the front side surface in an area where the front side surface is not covered by the screening layer.

19. The method of claim 18, wherein a same mask is used for the first masked implantation and the third masked implantation.

20. The method of claim 18, wherein the third masked implantation is carried out at a lower energy than the first masked implantation such that the dopants of the second type do not penetrate the screening layer during the third masked implantation.

21. A method of processing a power semiconductor device, the method comprising:

providing a semiconductor body having a front side surface and including a drift region having dopants of a first conductivity type; and forming inside the semiconductor body an edge termination region, wherein forming the edge termination region comprises:
forming a first doped semiconductor region extending along the front side surface and forming a continuous pn-junction with the drift region; and
forming a further doped semiconductor region in the semiconductor body, wherein forming the first doped semiconductor region and the further doped semiconductor region comprises:
forming a structured screening layer on the front side, the structured screening layer covering the first doped semiconductor region to be formed, wherein the structured screening layer is not present on the further doped semiconductor region to be formed;
implanting by means of a first mask, in a first implantation step, dopants through the structured screening layer and into the semiconductor body with a first implantation energy; and
implanting by means of the first mask, in a further implantation step, dopants into the structured screening layer and into the semiconductor body with a second implantation energy that is lower than the first implantation energy, wherein the first mask is open above the further doped semiconductor region to be formed, and
wherein the first mask defines first open areas and first masked areas,
wherein in a cross-section along a horizontal direction, an area ratio of the first open areas to the first masked areas above the first semiconductor region decreases in a direction pointing from an active region of the power semiconductor device to a lateral edge of the semiconductor body.

* * * * *

UNITED STATES PATENT AND TRADEMARK OFFICE
CERTIFICATE OF CORRECTION

PATENT NO. : 11,289,595 B2
APPLICATION NO. : 16/924466
DATED : March 29, 2022
INVENTOR(S) : F. Pfirsch It is certified that error appears in the above-identified patent and that said Letters Patent is hereby corrected as shown below:

On the Title Page

Item (57), abstract (Line 13), please change "of the both" to -- of both --.

Signed and Sealed this
Seventeenth Day of May, 2022

Katherine Kelly Vidal
*Director of the United States Patent and Trademark Office*